United States Patent
Ahn et al.

(10) Patent No.: US 9,899,632 B2
(45) Date of Patent: Feb. 20, 2018

(54) DISPLAY PANEL AND ORGANIC LIGHT EMITTING DISPLAY DEVICE HAVING A DISPLAY PANEL

(71) Applicant: Samsung Display Co., Ltd., Yongin (KR)

(72) Inventors: Ki-Wan Ahn, Seoul (KR); Yong-Jae Jang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 67 days.

(21) Appl. No.: 14/818,714

(22) Filed: Aug. 5, 2015

(65) Prior Publication Data

US 2016/0172633 A1 Jun. 16, 2016

(30) Foreign Application Priority Data

Dec. 11, 2014 (KR) .................. 10-2014-0178631

(51) Int. Cl.
  *H01L 51/52* (2006.01)
  *H01L 27/32* (2006.01)

(52) U.S. Cl.
  CPC ........ *H01L 51/5281* (2013.01); *H01L 27/326* (2013.01); *H01L 27/3267* (2013.01); *H01L 27/3272* (2013.01); *H01L 51/524* (2013.01); *H01L 51/5253* (2013.01); *H01L 27/3258* (2013.01); *H01L 2227/323* (2013.01)

(58) Field of Classification Search
  None
  See application file for complete search history.

(56) References Cited

U.S. PATENT DOCUMENTS

| 8,310,149 B2 | 11/2012 | Lifka et al. |
| 2007/0120465 A1* | 5/2007 | Ito ................ G02F 1/133555 313/504 |
| 2007/0194702 A1 | 8/2007 | Jeng et al. |
| 2008/0018827 A1* | 1/2008 | Yamamoto ........ G02F 1/133606 349/64 |
| 2009/0289910 A1* | 11/2009 | Hattori .............. G02F 1/13338 345/173 |
| 2010/0193804 A1* | 8/2010 | Brown .............. G02F 1/13318 257/84 |
| 2010/0237374 A1 | 9/2010 | Chu et al. |

(Continued)

FOREIGN PATENT DOCUMENTS

| KR | 10-2011-0071698 | 6/2011 |
| KR | 10-2012-0051337 | 5/2012 |

(Continued)

OTHER PUBLICATIONS

The Extended European Search Report dated May 2, 2016, in European Patent Application No. 15180071.1.

*Primary Examiner* — Lex Malsawma
(74) *Attorney, Agent, or Firm* — H.C. Park & Associates, PLC

(57) ABSTRACT

A display panel includes a substrate, light emitting structures disposed on an upper surface of the substrate in pixel regions, an encapsulation substrate disposed over the light emitting structures, and a light blocking member disposed on a lower surface of the substrate. The light blocking member has blocking portions corresponding to the pixel regions and openings corresponding to transparent regions.

16 Claims, 18 Drawing Sheets

(56) References Cited

U.S. PATENT DOCUMENTS

| | | | |
|---|---|---|---|
| 2011/0128264 A1* | 6/2011 | Lee | G02F 1/1334 345/207 |
| 2011/0163664 A1* | 7/2011 | Kang | H01L 27/3232 313/504 |
| 2011/0204369 A1* | 8/2011 | Ha | H01L 51/5228 257/59 |
| 2011/0221661 A1 | 9/2011 | Yoon et al. | |
| 2012/0176355 A1* | 7/2012 | Sugita | G06F 3/0412 345/207 |
| 2013/0314452 A1* | 11/2013 | Ko | G02F 1/134336 345/690 |
| 2013/0314453 A1* | 11/2013 | Ko | G09G 5/10 345/690 |
| 2014/0184577 A1* | 7/2014 | Kim | G09G 5/10 345/207 |
| 2014/0239272 A1 | 8/2014 | Kim | |
| 2015/0124199 A1* | 5/2015 | Su | G02F 1/133603 349/69 |
| 2015/0349028 A1* | 12/2015 | Lee | H01L 27/32 349/86 |
| 2015/0371579 A1* | 12/2015 | Yu | G09G 3/32 345/690 |

FOREIGN PATENT DOCUMENTS

| | | |
|---|---|---|
| KR | 10-2013-0138883 | 12/2013 |
| KR | 10-2014-0049666 | 4/2014 |
| WO | 2010/046833 | 4/2010 |

\* cited by examiner

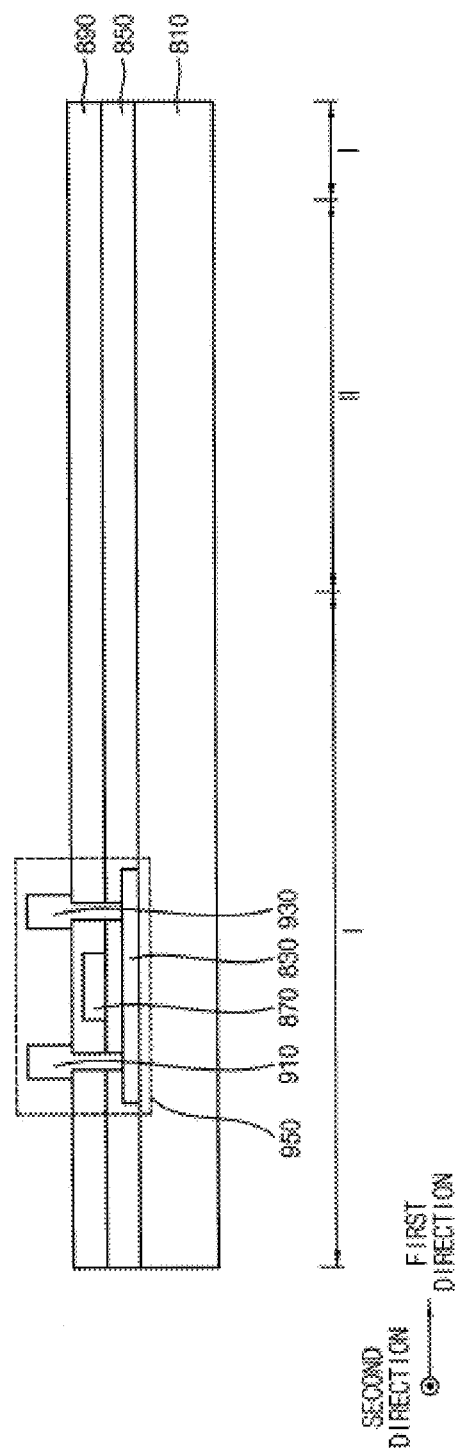

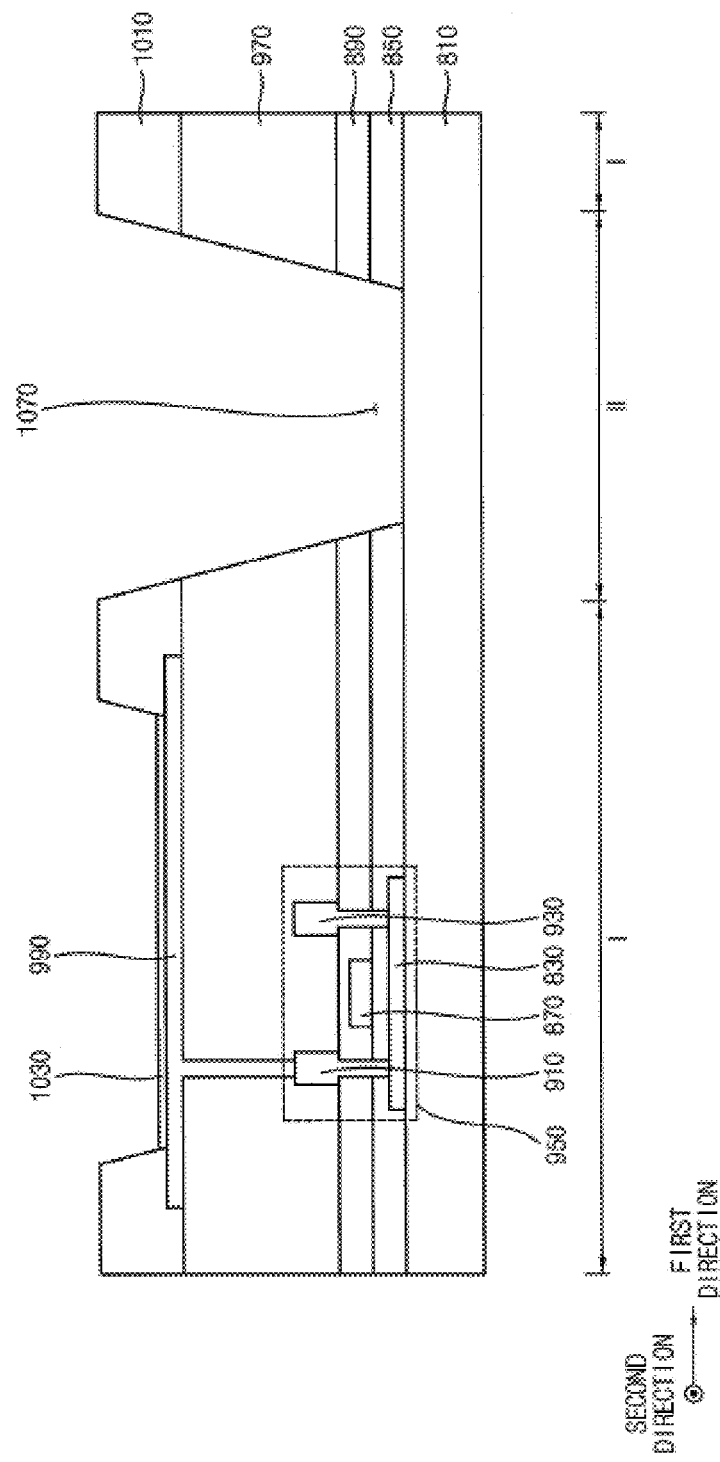

DISPLAY PANEL AND ORGANIC LIGHT EMITTING DISPLAY DEVICE HAVING A DISPLAY PANEL

CROSS-REFERENCE TO RELATED APPLICATION

This application claims priority from and the benefit of Korean Patent Application No. 10-2014-0178631, filed on Dec. 11, 2014, which is hereby incorporated by reference for all purposes as if fully set forth herein.

BACKGROUND

Field

Exemplary embodiments relate generally to a display panel including a light blocking member and an organic light emitting display device having a display panel including a light blocking member.

Discussion of the Background

A flat panel display (FPD) device may be used as a display device for an electronic device. A FPD device is lightweight and thin compared to a cathode-ray tube (CRT) display device. Typical examples of the FPD device are a liquid crystal display (LCD) device and an organic light emitting display (OLED) device. Compared to the LCD device, the OLED device can provide advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby emitting light of a wavelength determined by the configuration of the OLED device.

A transparent OLED device, capable of transmitting an image of an object (or target) that is located in the rear of the OLED device, can include a transparent region and a pixel region. An electronic device (e.g., cover display device), connected to a display device, can employ the transparent OLED device. The transparent OLED device may serve as a cover of the display device, for example, and the cover may be in an open state or a closed state. In this case, when a user watches an image displayed in the display device through the transparent OLED device in the closed state, visibility of the electronic device may be reduced because a portion of light emitted in the display device is reflected by a lower surface of the transparent OLED device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display panel including a light blocking member disposed on a lower surface of a substrate. Exemplary embodiments also provide an organic light emitting display device including a display panel having a light blocking member disposed on a lower surface of the substrate.

Additional aspects will be set forth in the detailed description which follows, and, in part, will be apparent from the disclosure, or may be learned by practice of the inventive concept.

According to one aspect of the exemplary embodiments, a display panel includes a substrate, light emitting structures disposed on an upper surface of the substrate in pixel regions, an encapsulation substrate disposed over the light emitting structures, and a light blocking member disposed on a lower surface of the substrate. The light blocking member has blocking portions corresponding to the pixel regions and openings corresponding to transparent regions.

According to another aspect of the exemplary embodiments, an organic light emitting display device includes a first display panel, a first body surrounding the first display panel, a second display panel opposite to the first display panel, a second body surrounding the second display panel, and a connection member connecting the first body and the second body. The first display panel includes a substrate, light emitting structures disposed on an upper surface of the substrate in pixel regions, an encapsulation substrate disposed over the light emitting structures, and a light blocking member disposed on a lower surface of the substrate. The light blocking member has blocking portions corresponding to the pixel regions and openings corresponding to transparent regions.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIGS. 4A through 4E are cross sectional views illustrating a method of manufacturing a display panel in accordance with one or more exemplary embodiments.

DETAILED DESCRIPTION OF THE ILLUSTRATED EMBODIMENTS

Figure 1:
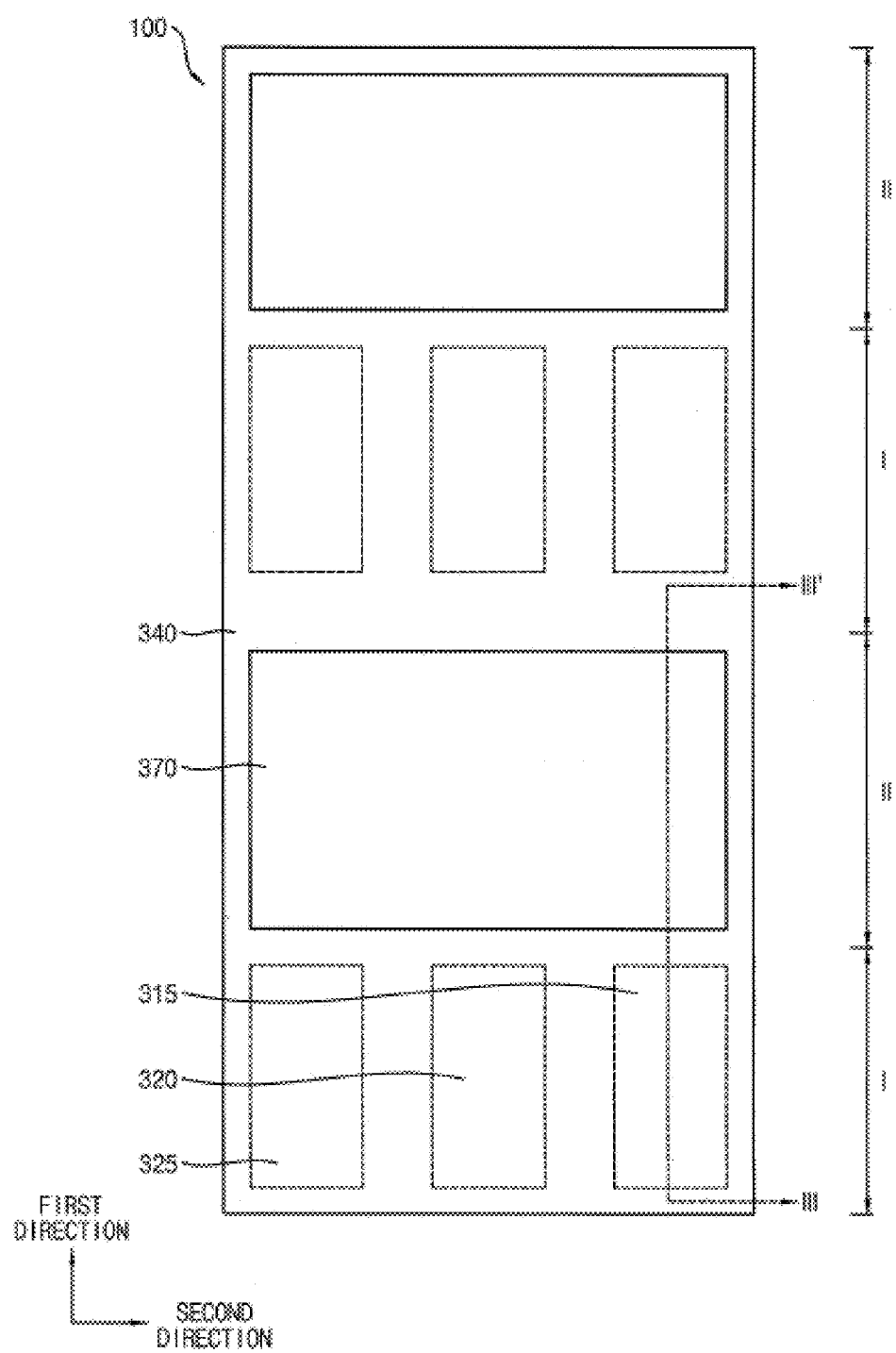
FIG. 1 is a plan view illustrating a display panel in accordance with one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
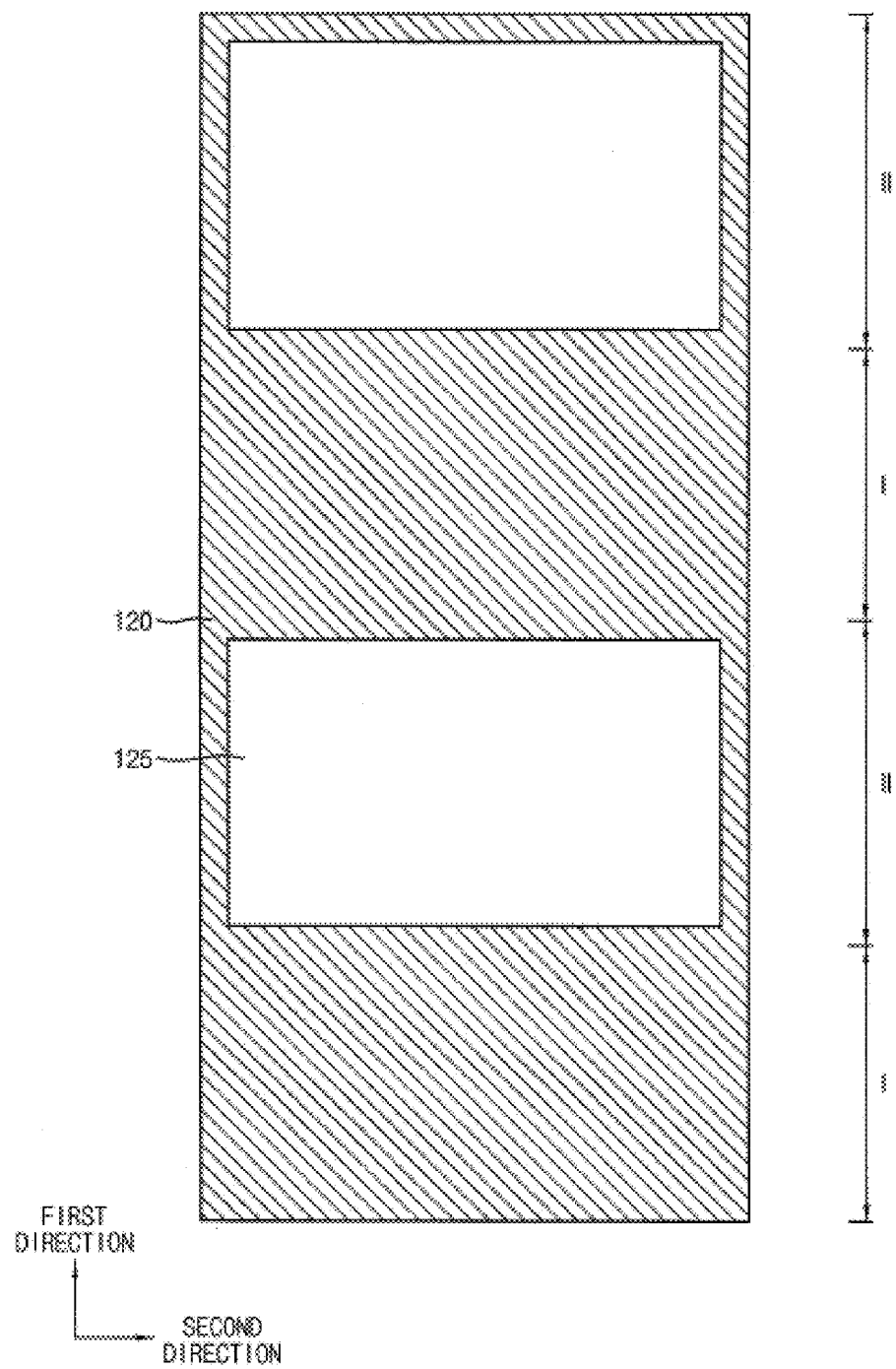
FIG. 2 is a plan view for describing a light blocking member included in a display panel of FIG. 1.

FIG. 1 is a plan view illustrating a display panel in accordance with one or more exemplary embodiments, and FIG. 2 is a plan view for describing a light blocking member included in the display panel of FIG. 1.

Referring to FIGS. 1 and 2, display panel 100 may include a plurality of pixel regions I and a plurality of transparent regions II. Sub pixel regions may be located in one pixel region I. Each of first through third pixels 315, 320, and 325 may be located in each of the sub pixel regions. A transparent window 370 may be located in a transparent region II. A pixel region I may be located adjacent to a transparent region II.

Figure 3:
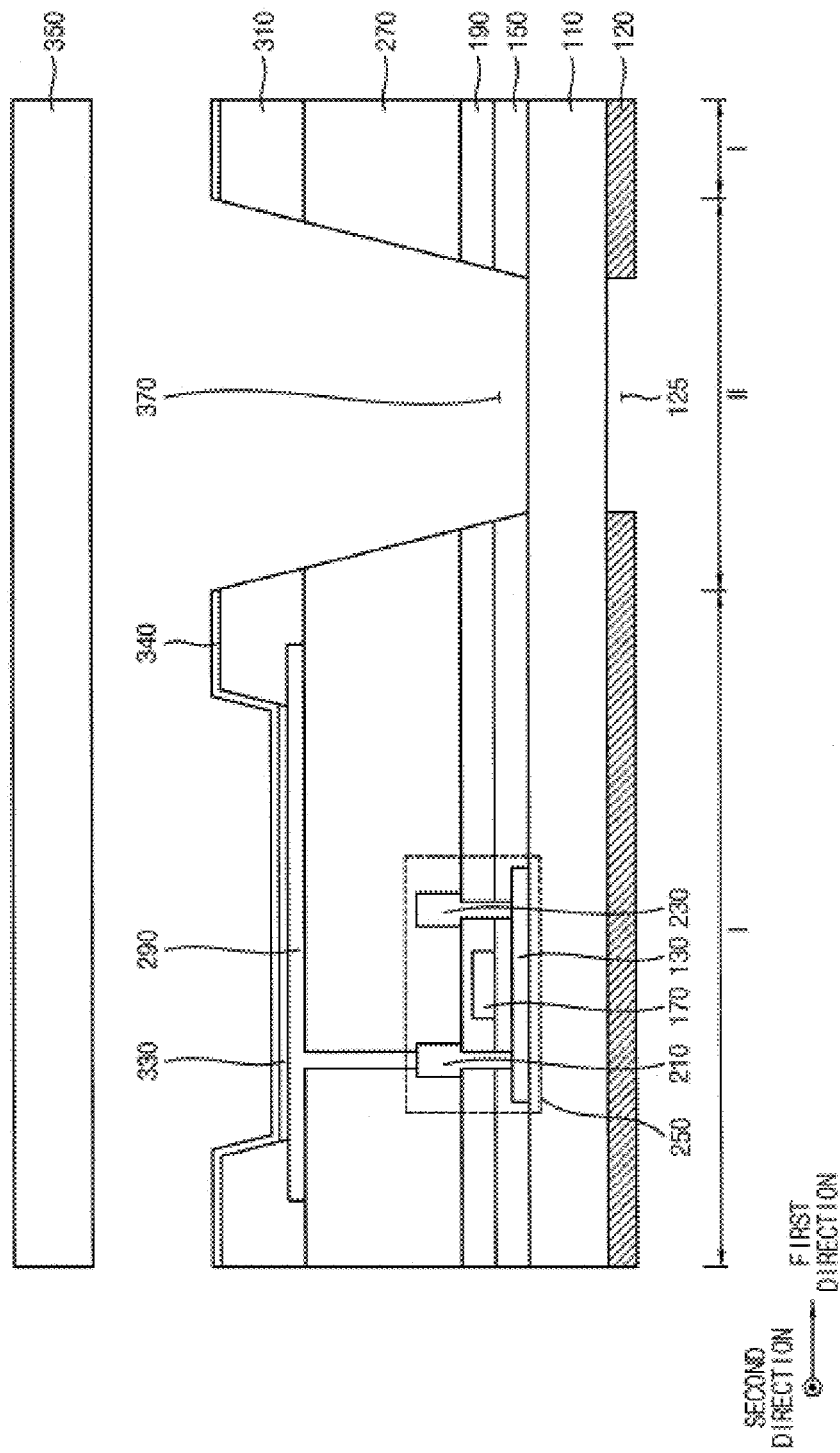
FIG. 3 is a cross sectional view illustrating a display panel taken along a line III-III' of FIG. 1.

In the pixel region I, first pixel 315 may be a pixel emitting a red color. Second pixel 320 may be a pixel emitting a green color. Third pixel 325 may be a pixel emitting a blue color. The first through third pixels 315, 320, and 325 may be located on an upper surface of substrate 110 (FIG. 3). The first through third pixels may be disposed at the same layer.

In the transparent region II, transparent window 370 may transmit an external light. Here, common lines (e.g., data lines, scan lines, power supply lines, etc.) and insulation layers (a pixel defining layer, a protection layer, etc.) may be disposed in a portion (e.g., a dead space) that surrounds the first through third pixels 315, 320, and 325 and the transparent window 370. For example, a pixel defining layer may surround the first through third pixels 315, 320, and 325 and transparent window 370. In addition, a cathode electrode may be disposed on the pixel defining layer and the first through third pixels 315, 320, and 325.

As illustrated in FIG. 2, in exemplary embodiments, light blocking member 120 may be disposed on a lower surface of substrate 110 included in display panel 100. Light blocking member 120 may include opening 125 that is located in the transparent region II. A size of opening 125 may be the same as that of the transparent region II (e.g., transparent window 370). In exemplary embodiments, light blocking member 120 may extend along a first direction from the pixel region I to the transparent region II on the lower surface of the substrate. Here, a size of opening 125 of light blocking member 120 may be less than that of transparent window 370.

FIG. 3 is a cross sectional view illustrating a display panel taken along a line III-III' of FIG. 1.

Referring to FIG. 3, display panel 100 may include substrate 110, light blocking member 120, first insulation layer 150, second insulation layer 190, third insulation layer 270, light emitting structure, fourth insulation layer 310, transparent window 370, and encapsulation substrate 350. Here, the light emitting structure may include semiconductor element 250, first electrode 290, light emitting layer 330, and second electrode 340. Semiconductor element 250 may include active layer 130, gate electrode 170, source electrode 210, and drain electrode 230. Light blocking member 120 may include opening 125.

As described above, display panel 100 may include a plurality of pixel regions I and a plurality of transparent regions II. Semiconductor element 250, first electrode 290, light emitting layer 330, and second electrode 340, and light blocking member 120 may be located in one of the pixel regions I. In addition, transparent window 370 may be located in one of the transparent regions II. For example, a display image may be displayed in the pixel regions I. An object (e.g., an image of an object) that is located in the rear of (e.g., underneath) display panel 100 may be viewed through transparent regions II. As display panel 100 has transparent regions II, display panel 100 may serve as a transparent display device.

The light emitting structure may be disposed on an upper surface of substrate 110. Light blocking member 120 may be disposed on a lower surface of substrate 110. Substrate 110 may include transparent materials. For example, substrate 110 may include quartz, synthetic quartz, calcium fluoride, fluoride-doping quartz, a sodalime glass, a non-alkali glass, etc. Substrate 110 may include a flexible transparent resin substrate. Here, the flexible transparent resin substrate for substrate 110 may include a polyimide substrate. For example, the polyimide substrate may include a first polyimide layer, a barrier film layer, a second polyimide layer, etc. When the polyimide substrate is thin and flexible, the polyimide substrate may be formed on a rigid glass substrate to help support the formation of the light emitting structures. That is, in exemplary embodiments, substrate 110 may have a structure in which the first polyimide layer, the barrier film layer and the second polyimide layer are stacked on a glass substrate. Here, after an insulation layer is provided on the second polyimide layer, the light emitting structures may be disposed on the insulation layer. After the light emitting structures are formed on the insulation layer, the glass substrate may be removed. To reduce the difficulty of directly forming the light emitting structures on the polyimide substrate, because the polyimide substrate is thin and flexible, the light emitting structures may be formed by using a rigid glass substrate as a support, and then the polyimide substrate may serve as substrate 110 after the removal of the glass substrate. As display panel 100 includes a plurality of the pixel regions I and a plurality of the transparent regions II, substrate 110 may also include plurality of the pixel regions I and a plurality of the transparent regions II.

Referring to FIG. 3, a buffer layer (not shown) may be disposed on substrate 110. The buffer layer may extend from a pixel region I into a transparent region II. The buffer layer may prevent the diffusion (e.g., an out gassing) of metal atoms and/or impurities from substrate 110. Additionally, the buffer layer may control a rate of a heat transfer in a crystallization process for forming active layer 130, thereby obtaining a substantially uniform active layer 130. Furthermore, the buffer layer may improve the surface flatness of substrate 110 when a surface of substrate 110 is relatively irregular. According to the type of substrate 110, at least two buffer layers may be provided on substrate 110, or the buffer layer may not be disposed.

Light blocking member 120 may be disposed on the lower surface of substrate 110, and extend along a first direction from a pixel region I to a transparent region II. In exemplary embodiments, light blocking member 120 may include opening 125 in a transparent region II. The size of opening 125 may be less than the size of transparent region II. Light blocking member 120 may reduce external light reflected from substrate 110 and the light emitting structure except in the portion of the transparent region II in which the opening 125 is located. To reduce reflection of external light, light blocking member 120 may include light blocking materials. For example, the light blocking materials may include carbon black, titanium nitride oxide, titanium black, phenylene black, aniline black, cyanine black, nigrosine acid black, etc. Light blocking member 120 may include a resin having the light blocking materials. The resin may include epoxy resin, acryl resin, siloxane resin, polymer resin, polyimide resin, etc. In exemplary embodiments, when the light emitting structure is disposed on an upper surface of substrate 110 after the light blocking member 120 is disposed on the lower surface of the substrate 110, light blocking member 120 may include the siloxane resin which has a high heat resistance. As display panel 100 includes light blocking member 120 having opening 125, reflection of the external light generated in display panel 100 may be reduced. Accordingly, visibility of display panel 100 may be improved. In addition, as second electrode 340 may not be disposed in a transparent region II, transmissivity of display panel 100 may be improved, and definition of an image of an object that is located to the rear of display panel 100 may increase.

Semiconductor element 250 may include active layer 130, gate electrode 170, source electrode 210, and drain electrode 230. For example, active layer 130 may be disposed on substrate 110. Active layer 130 may include an oxide semiconductor, an inorganic semiconductor (e.g., amorphous silicon, polysilicon, etc.), an organic semiconductor, etc.

First insulation layer 150 may be disposed on active layer 130. First insulation layer 150 may cover active layer 130 in the pixel region I, and may extend into the transparent region II. In exemplary embodiments, when transparent window 370 is formed, a portion of first insulation layer 150 may be removed in the transparent region II. First insulation layer 150 may include a silicon compound, a metal oxide, etc.

Gate electrode 170 may be disposed on first insulation layer 150 under which active layer 130 is located. Gate electrode 170 may include metal, alloy, metal nitride, conductive metal oxide, transparent conductive materials, etc.

Second insulation layer 190 may be disposed on gate electrode 170. Second insulation layer 190 may cover gate electrode 170 in a pixel region I, and may extend into a transparent region II. In exemplary embodiments, when transparent window 370 is formed, a portion of second insulation layer 190 may be removed in the transparent region II. Second insulation layer 190 may include a silicon compound, a metal oxide, etc.

Source electrode 210 and drain electrode 230 may be disposed on second insulation layer 190. Source electrode 210 may contact a first side of active layer 130 by removing a first portion of the first and second insulation layers 150 and 190. Drain electrode 230 may contact a second side of the active layer 130 by removing a second portion of the first and second insulation layers 150 and 190. Each of the source electrode 210 and the drain electrode 230 may include metal, alloy, metal nitride, conductive metal oxide, transparent conductive materials, etc.

Third insulation layer 270 may be disposed on source electrode 210 and drain electrode 230. Third insulation layer 270 may cover source electrode 210 and drain electrode 230 in a pixel region I, and may extend into a transparent region II. In exemplary embodiments, when transparent window 370 is formed, a portion of third insulation layer 270 may be removed in the transparent region II. Third insulation layer 270 may include a silicon compound, a metal oxide, etc.

As illustrated in FIG. 3, first electrode 290 may be disposed on third insulation layer 270. First electrode 290 may be contacted to source electrode 210 by removing a portion of third insulation layer 270. First electrode 290 may include metal, alloy, metal nitride, conductive metal oxide, transparent conductive materials, etc.

Fourth insulation layer 310 (e.g., a pixel defining layer) may be disposed on third insulation layer 270 to expose a portion of first electrode 290. Fourth insulation layer 310 may include organic materials or inorganic materials. In this case, fourth insulation layer 310 may include a first opening and a second opening. In the pixel region I, the first opening of fourth insulation layer 310 may expose a portion of first electrode 290. Light emitting layer 330 may be disposed on exposed first electrode 290. In addition, in the transparent region II, the second opening of fourth insulation layer 310 may expose a portion of third insulation layer 270. The second opening may be transparent window 370. In exemplary embodiments, transparent window 370 may be formed by removing a portion of the insulation layers. For example, transparent window 370 may be formed by removing a portion of first insulation layer 150, second insulation layer 190, third insulation layer 270, and fourth insulation layer 310.

Light emitting layer 330 may be disposed on exposed first electrode 290. Light emitting layer 330 may be formed by using light emitting materials capable of generating different colors of light (e.g., a red color of light, a blue color of light, and a green color of light) to correspond to the first through third pixels 315, 320, and 325 illustrated in FIG. 1.

Second electrode 340 may be disposed on fourth insulation layer 310 and light emitting layer 330. Second electrode 340 may cover fourth insulation layer 310 and light emitting layer 330 in a pixel region I, and may extend into a transparent region II. In addition, second electrode 340 may be shared by (e.g., electrically connected to) the first through third pixels 315, 320, and 325. In exemplary embodiments, after transparent window 370 is formed, an organic material is disposed in an inside of transparent window 370. When the organic material is disposed in the inside of transparent window 370, second electrode 340 may not be disposed in the portion on which the organic material is located during forming the second electrode 340 That is, a portion on which second electrode 340 is disposed may be controlled. Thus, to increase transmissivity in a transparent region II, second electrode 340 may not be disposed in the inside of the transparent window 370. Second electrode 340 may include metal, alloy, metal nitride, conductive metal oxide, a transparent conductive material, etc. These may be used alone or in a combination thereof. In addition, the organic material may include a blue host material.

Encapsulation substrate 350 may be disposed over second electrode 340, fourth insulation layer 310, and transparent window 370. Encapsulation substrate 350 and substrate 110 may include substantially the same materials. For example, encapsulation substrate 350 may include quartz, synthetic quartz, calcium fluoride, fluoride-doping quartz, sodalime glass, non-alkali glass etc. In some exemplary embodiments, encapsulation substrate 350 may include a transparent inorganic material or flexible plastic. For example, encapsulation substrate 350 may include a flexible transparent resin substrate. In this case, to increase flexibility of display panel 100, encapsulation substrate 350 may include a stacked structure where at least one organic layer and at least one inorganic layer are alternately stacked. Alternately, when first insulation layer 150, second insulation layer 190, and third insulation layer 270 have the same materials and substrate 110, encapsulation substrate 350, first insulation layer 150, second insulation layer 190, and third insulation layer 270 have a similar refractive index, light incident into a transparent region II may not be refracted in each of contact interfaces of substrate 110, encapsulation substrate 350, first insulation layer 150, second insulation layer 190, and third insulation layer 270. Accordingly, the transmissivity of display panel 100 may increase, and the definition of the image may be improved.

Display panel 100 in accordance with exemplary embodiments includes light blocking member 120 having opening 125. Accordingly, display panel 100 may serve as a transparent display device that may reduce the reflection of the external light, and the visibility of display panel 100 may increase. In addition, as second electrode 340 is not located in a transparent window 370 in transparent region II, the transmissivity of the display panel 100 may increase. The definition of the image of the object that is located in the rear of display panel 100 may increase. Further, when first insulation layer 150, second insulation layer 190, and third insulation layer 270 include the same materials, contact interfaces capable of reflecting light may decrease. Thus, the transmissivity of display panel 100 may further increase, and the definition of the image of the object that is located in the rear of display panel 100 may further increase.

FIGS. 4A through 4E are cross sectional views illustrating a method of manufacturing a display panel in accordance with one or more exemplary embodiments.

Figure 4A:
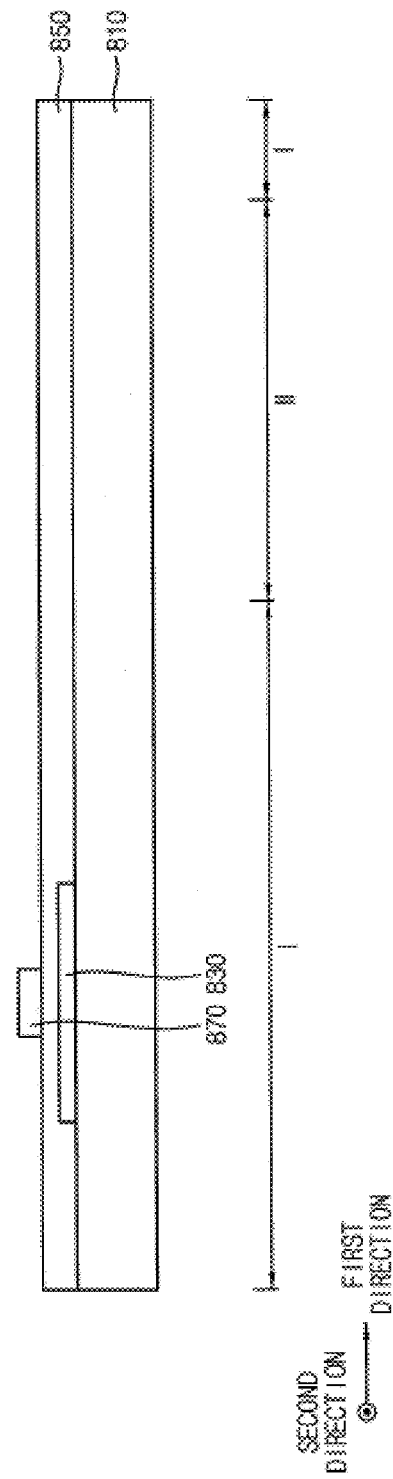

Referring to FIG. 4A, active layer 830 may be formed in a pixel region I of substrate 810. Substrate 810 may be formed by using quartz, synthetic quartz, calcium fluoride, fluoride-doping quartz, a sodalime glass, a non-alkali glass etc. A buffer layer may be formed on substrate 810 in some exemplary embodiments. The buffer layer may be entirely formed from the pixel region I into a transparent region II. The buffer layer may prevent the diffusion of metal atoms and/or impurities from substrate 810. Active layer 830 may be formed by using an oxide semiconductor, an inorganic semiconductor, an organic semiconductor, etc. First insulation layer 850 may be formed on substrate 810. First insulation layer 850 may cover active layer 830, and may extend from a transparent region II. First insulation layer 850 may be formed across pixel regions I and transparent regions II on substrate 810. First insulation layer 850 may be formed by using a silicon compound, a metal oxide, etc. Gate electrode 870 may be formed on first insulation layer 850 under which active layer 830 is located. Gate electrode 870 may be formed by using metal, alloy, metal nitride, conductive metal oxide, transparent conductive materials, etc.

Referring to FIG. 4B, second insulation layer 890 may be formed on gate electrode 870. Second insulation layer 890 may cover gate electrode 870, and may extend from a pixel region I into a transparent region II. Second insulation layer 890 may be formed across pixel region I and transparent region II on substrate 810. Second insulation layer 890 may be formed by using a silicon compound, a metal oxide, etc. Source electrode 910 and drain electrode 930 may be formed on second insulation layer 890. Source electrode 910 may contact a first side of active layer 830 by removing a first portion of the first and second insulation layers 850 and 890, and drain electrode 930 may contact a second side of active layer 830 by removing a second portion of the first and second insulation layers 850 and 890. Each of source electrode 910 and drain electrode 930 may be formed by using metal, alloy, metal nitride, conductive metal oxide, transparent conductive materials, etc. These may be used alone or in a combination thereof. In this way, semiconductor element 950 having source electrode 910, drain electrode 930, gate electrode 870, and active layer 830 may be formed.

Figure 4C:
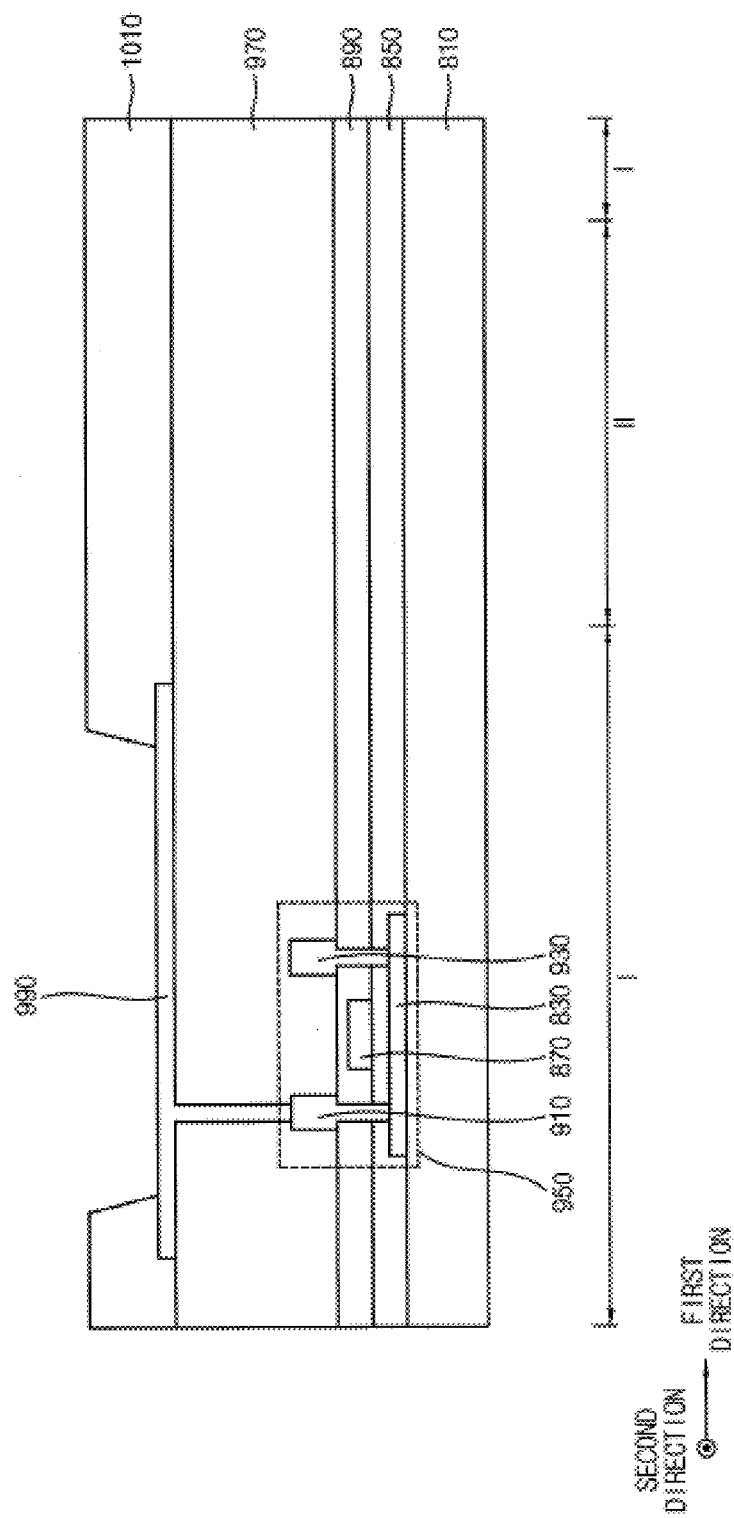

Referring to FIG. 4C, third insulation layer 970 may be formed on second insulation layer 890. Third insulation layer 970 may cover source electrode 910 and drain electrode 930, and may extend from a pixel region I into a transparent region II. Third insulation layer 970 may be formed across the pixel regions I and the transparent regions II on substrate 810. Third insulation layer 970 may be formed by using a silicon compound, a metal oxide, etc. First electrode 990 may be formed on third insulation layer 970. First electrode 990 may contact the source electrode 910 by removing a portion of third insulation layer 970. First electrode 990 may be formed by using metal, alloy, metal nitride, conductive metal oxide, transparent conductive materials, etc. Fourth insulation layer 1010 may be formed on a portion of third insulation layer 970 and a portion of first electrode 990. Fourth insulation layer 1010 may include a first opening. In a pixel region I, the first opening of fourth insulation layer 1010 may be located in a portion of first electrode 990 formed on third insulation layer 970. Fourth insulation layer 1010 may be formed by using organic materials or inorganic materials.

Referring to FIG. 4D, light emitting layer 1030 may be formed in the first opening formed in fourth insulation layer 1010. Light emitting layer 1030 may be formed by using at least one of light emitting materials capable of generating different colors of light. In a transparent region II, a second opening is located. Here, the second opening may be transparent window 1070. For example, transparent window 1070 may be formed by removing a portion of first insulation layer 850, a portion of second insulation layer 890, a portion of third insulation layer 970, and a portion of fourth insulation layer 1010.

Figure 4E:
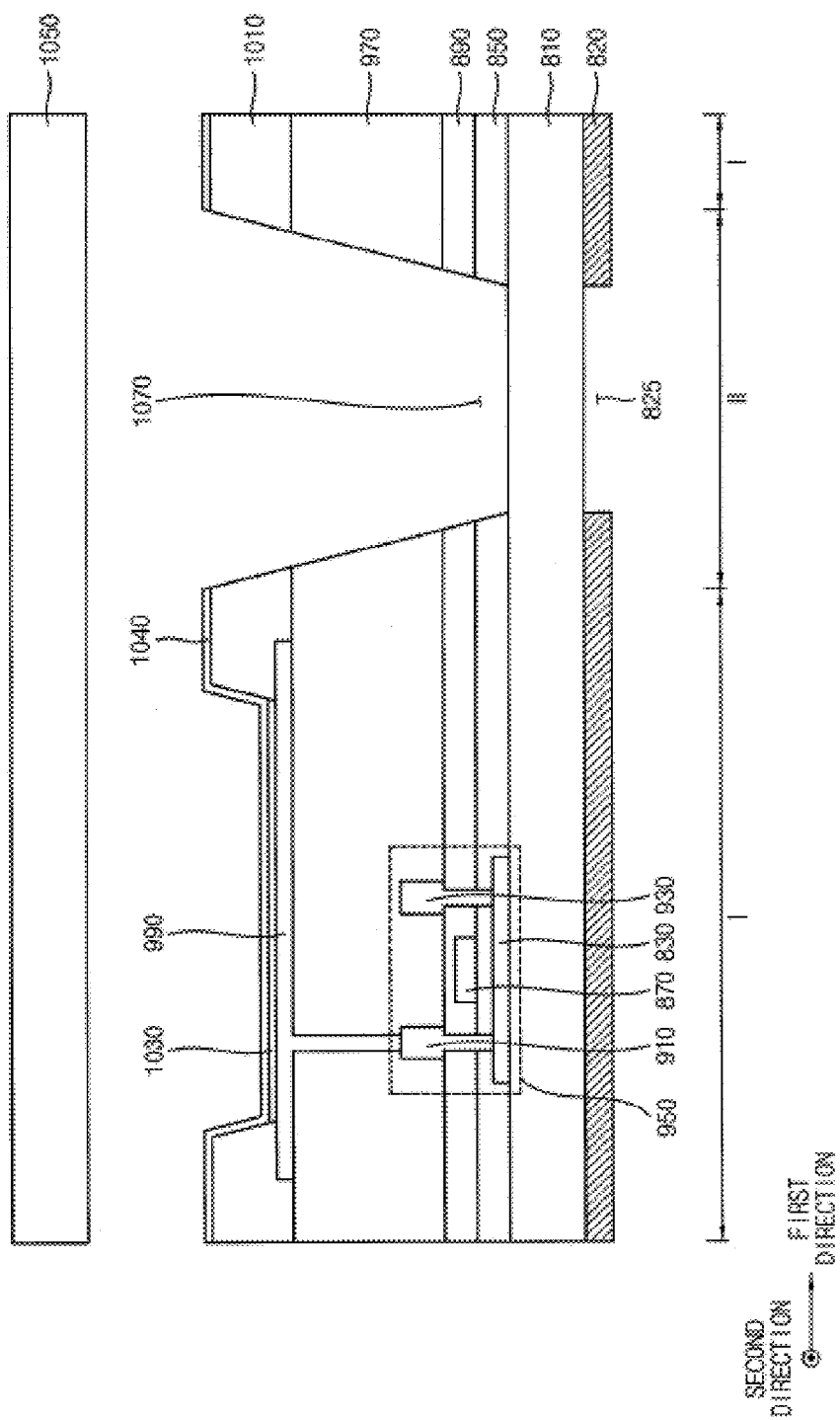

Referring to FIG. 4E, second electrode 1040 may be formed on fourth insulation layer 1010 and light emitting layer 1030. Second electrode 1040 may cover a portion of fourth insulation layer 1010 and light emitting layer 1030, and may extend from a pixel region I into a transparent region II. In exemplary embodiments, after transparent window 1070 is formed, an organic material may be formed inside of transparent window 1070. When the organic material is formed inside of transparent window 1070, second electrode 1040 may not be formed in the portion on which the organic material is located during forming second electrode 1040. That is, a portion on which second electrode 1040 is disposed may be controlled. Thus, to increase transmissivity in the transparent region II, second electrode 1040 may not be formed in the transparent window 1070 in transparent region II. Second electrode 1040 may include metal, alloy, metal nitride, conductive metal oxide, a transparent conductive material, etc. These may be used alone or in a combination thereof. In addition, the organic material may be formed using a blue host material.

Encapsulation substrate 1050 may be formed over second electrode 1040, fourth insulation layer 1010, and transparent window 1070. Encapsulation substrate 1050 and substrate 810 may include substantially the same materials. For example, encapsulation substrate 1050 may be formed by using quartz, synthetic quartz, calcium fluoride, fluoride-doping quartz, sodalime glass, non-alkali glass etc.

In exemplary embodiments, light blocking member 820 may be formed on the lower surface of substrate 810, and extend along a first direction from a pixel region I into a transparent region II. Light blocking member 820 may include opening 825 in a transparent region II. A size of opening 825 may be less than the size of the transparent region II. Light blocking member 820 may reduce external light reflected from substrate 810 and the light emitting structure (e.g., semiconductor element 950, first electrode 990, light emitting layer 1030, and second electrode 1040) except in a portion of the transparent region II in which opening 825 is located. To prevent reflection of external light, light blocking member 820 may include light blocking materials. For example, the light blocking materials may include carbon black, titanium nitride oxide, titanium black, phenylene black, aniline black, cyanine black, nigrosine acid black, etc. Light blocking member 820 may include a resin having the light blocking materials. The resin capable of being used as light blocking member 820 may include epoxy resin, acryl resin, siloxane resin, polymer resin, polyimide resin, etc. In exemplary embodiments, when the light emitting structure is formed on an upper surface of substrate 810 after light blocking member 820 is disposed on the lower surface of substrate 810, light blocking member 820 may be formed by using the siloxane resin which has a high heat resistance.

Figure 5:
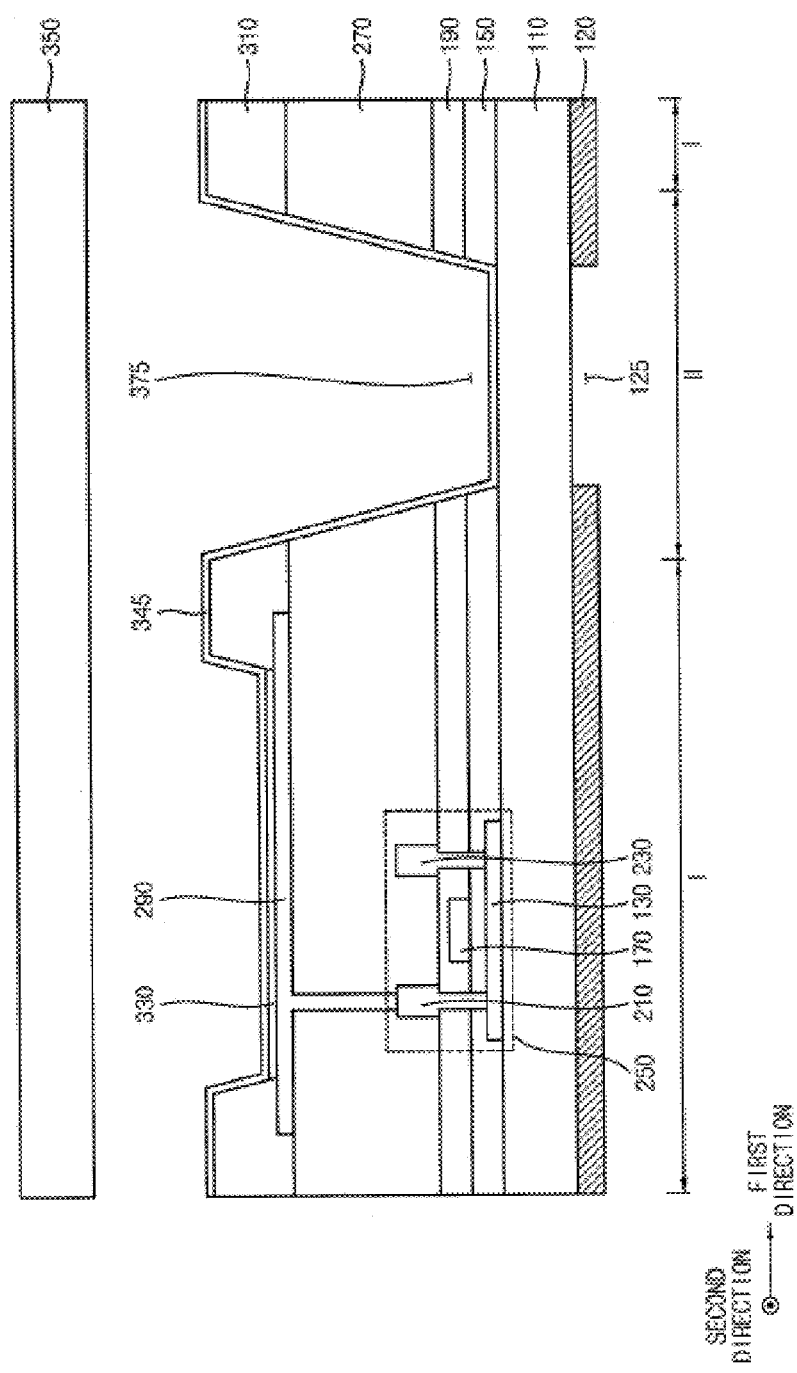
FIG. 5 is a cross sectional view illustrating a display panel in accordance with one or more exemplary embodiments.

FIG. 5 is a cross sectional view illustrating a display panel in accordance with one or more exemplary embodiments. A display panel illustrated in FIG. 5 may have a configuration substantially the same as or similar to that of display panel 100 described with reference to FIG. 3 except with regard to a shape of a second electrode. In FIG. 5, detailed descriptions for elements that are substantially the same as or similar to the elements described with reference to FIG. 3 will be omitted.

Referring to FIG. 5, a display panel may include substrate 110, light blocking member 120, first insulation layer 150, second insulation layer 190, third insulation layer 270, a light emitting structure, fourth insulation layer 310, transparent window 375, encapsulation substrate 350, etc. The light emitting structure may include semiconductor element 250, first electrode 290, light emitting layer 330, and second electrode 345. Semiconductor element 250 may include active layer 130, gate electrode 170, source electrode 210, and drain electrode 230. Light blocking member 120 may include opening 125.

As described above, the display panel may include a pixel region I and a transparent region II. Semiconductor element 250, first electrode 290, light emitting layer 330, second electrode 345, and light blocking member 120 may be located in a pixel region I. In addition, transparent window 375 may be located in a transparent region II. For example, a display image may be displayed in the pixel region I. An image of an object that is located to the rear of the display panel may be transmitted in the transparent region II. The display panel having the transparent region II may serve as a transparent display device.

Second electrode 345 may be disposed on fourth insulation layer 310, light emitting layer 330, and a portion of substrate 110. Second electrode 345 may cover fourth insulation layer 310 and light emitting layer 330 in the pixel region I, and may extend from the pixel region I into the transparent region II. That is, second electrode 345 may be disposed across in pixel regions I and transparent regions II. In addition, second electrode 345 may be shared by the first through third pixels (refer to FIG. 1). Second electrode 345 may be relatively a thin thickness. For example, a thickness of the second electrode 345 may be determined such that a light transmissivity of the second electrode 345 may be over about 50%. The second electrode 345 may include metal, alloy, metal nitride, conductive metal oxide, a transparent conductive material, etc. For example, the second electrode 345 may include aluminum (Al), aluminum alloy, aluminum nitride (AlNx), silver (Ag), silver alloy, tungsten (W), tungsten nitride (WNx), copper (Cu), copper alloy, nickel (Ni), chrome (Cr), chrome nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), stannum oxide (SnOx), indium oxide (InOx), gallium oxide (GaOx), indium zinc oxide (IZO), etc. These may be used alone or in a combination thereof. Compared to a display panel 100 of FIG. 3, as the display panel includes the second electrode 345 located in the transparent window 375, an IR drop capable of being generated in the display panel may decrease. In addition, as the second electrode 345 having a relatively thin thickness in the transparent region II is located, a transmissivity of the display panel may not be significantly reduced.

Figure 6:
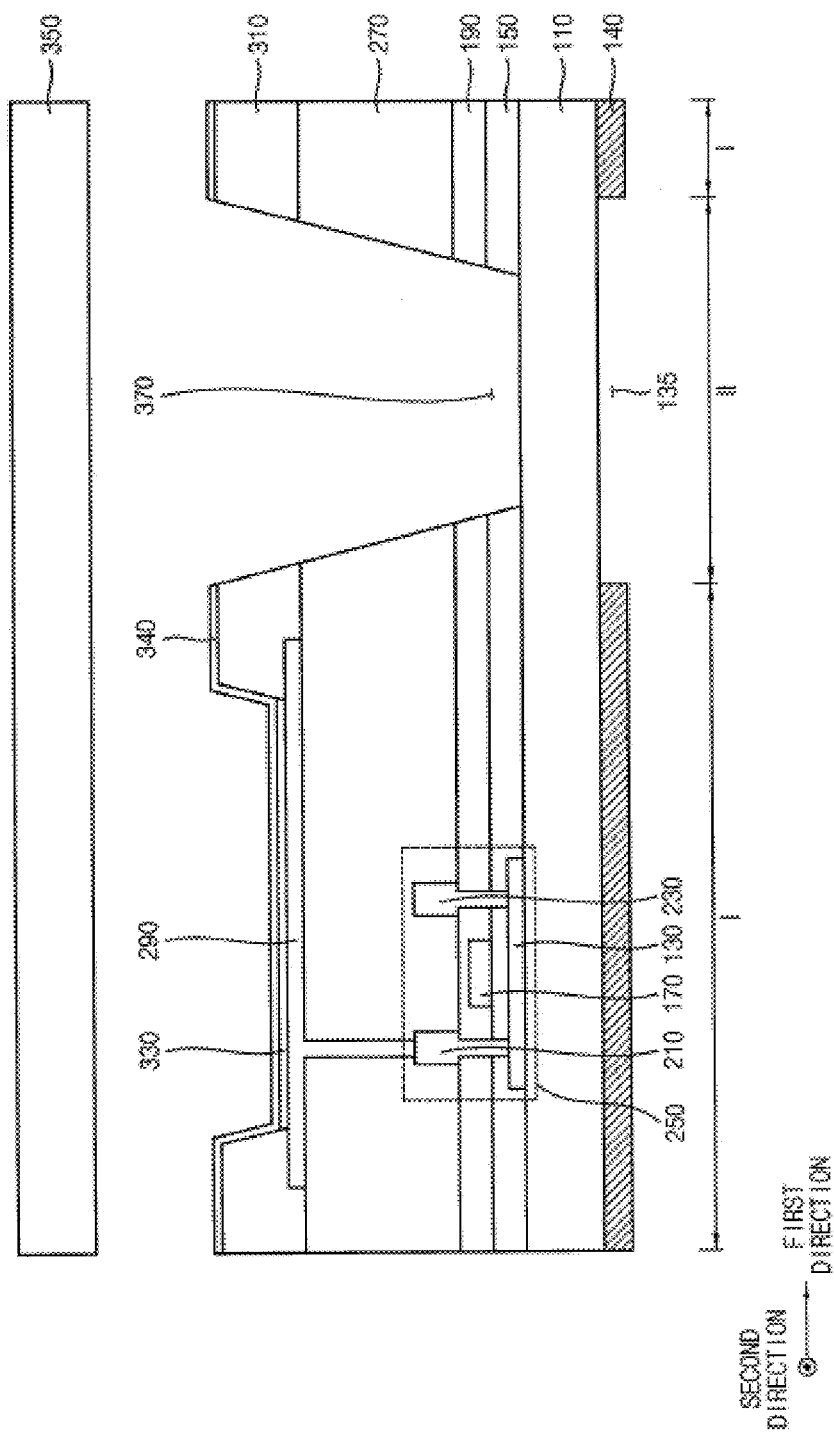
FIG. 6 is a cross sectional view illustrating a display panel in accordance with one or more exemplary embodiments.

FIG. 6 is a cross sectional view illustrating a display panel in accordance with one or more exemplary embodiments. A display panel illustrated in FIG. 6 may have a configuration substantially the same as or similar to that of display panel 100 described with reference to FIG. 3 except a shape of an opening. In FIG. 6, detailed descriptions for elements that are substantially the same as or similar to the elements described with reference to FIG. 3 will be omitted.

Referring to FIG. 6, a display panel may include substrate 110, light blocking member 140, first insulation layer 150, second insulation layer 190, third insulation layer 270, a light emitting structure, fourth insulation layer 310, transparent window 370, encapsulation substrate 350, etc. The light emitting structure may include semiconductor element 250, first electrode 290, light emitting layer 330, and second electrode 340. Semiconductor element 250 may include active layer 130, gate electrode 170, source electrode 210, and drain electrode 230. Light blocking member 140 may include opening 135.

As described above, the display panel may include a pixel region I and a transparent region II. Semiconductor element 250, first electrode 290, light emitting layer 330, second electrode 340, and light blocking member 140 may be located in pixel region I. In addition, transparent window 370 may be located in transparent region II. For example, a display image may be displayed in pixel region I. An image of an object that is located to the rear of the display panel may be transmitted in transparent region II. As the display panel has transparent regions II, the display device may serve as a transparent display device.

Light blocking member 140 may be disposed on a lower surface of the substrate 110, and extend along a first direction from the pixel region I towards transparent region II. In exemplary embodiments, light blocking member 140 may include opening 135 in transparent region II. A size of opening 135 may be the same as that of transparent region II and may correspond to a size in the first direction where second electrode 340 is not formed. Light blocking member 140 may prevent that external light from being reflected from substrate 110 and the light emitting structure except in a portion of transparent region II in which opening 135 located. To prevent reflection of the external light, light blocking member 140 may include light blocking materials. For example, the light blocking materials may include carbon black, titanium nitride oxide, titanium black, phenylene black, aniline black, cyanine black, nigrosine acid black, etc. Light blocking member 140 may include a resin having the light blocking materials. The resin capable of being used as light blocking member 140 may include epoxy resin, acryl resin, siloxane resin, polymer resin, polyimide resin, etc. In exemplary embodiments, when the light emitting structure is disposed on an upper surface of substrate 110 after light blocking member 140 is disposed on the lower surface of substrate 110, light blocking member 140 may include the siloxane resin which has a high heat resistance. As display panel 100 includes light blocking member 140 having opening 135 that is the same as a size of the transparent region II, transmissivity of the display device may relatively increase. In addition, a definition of an image of an object that is located in the rear of the display panel may increase.

Figure 7:
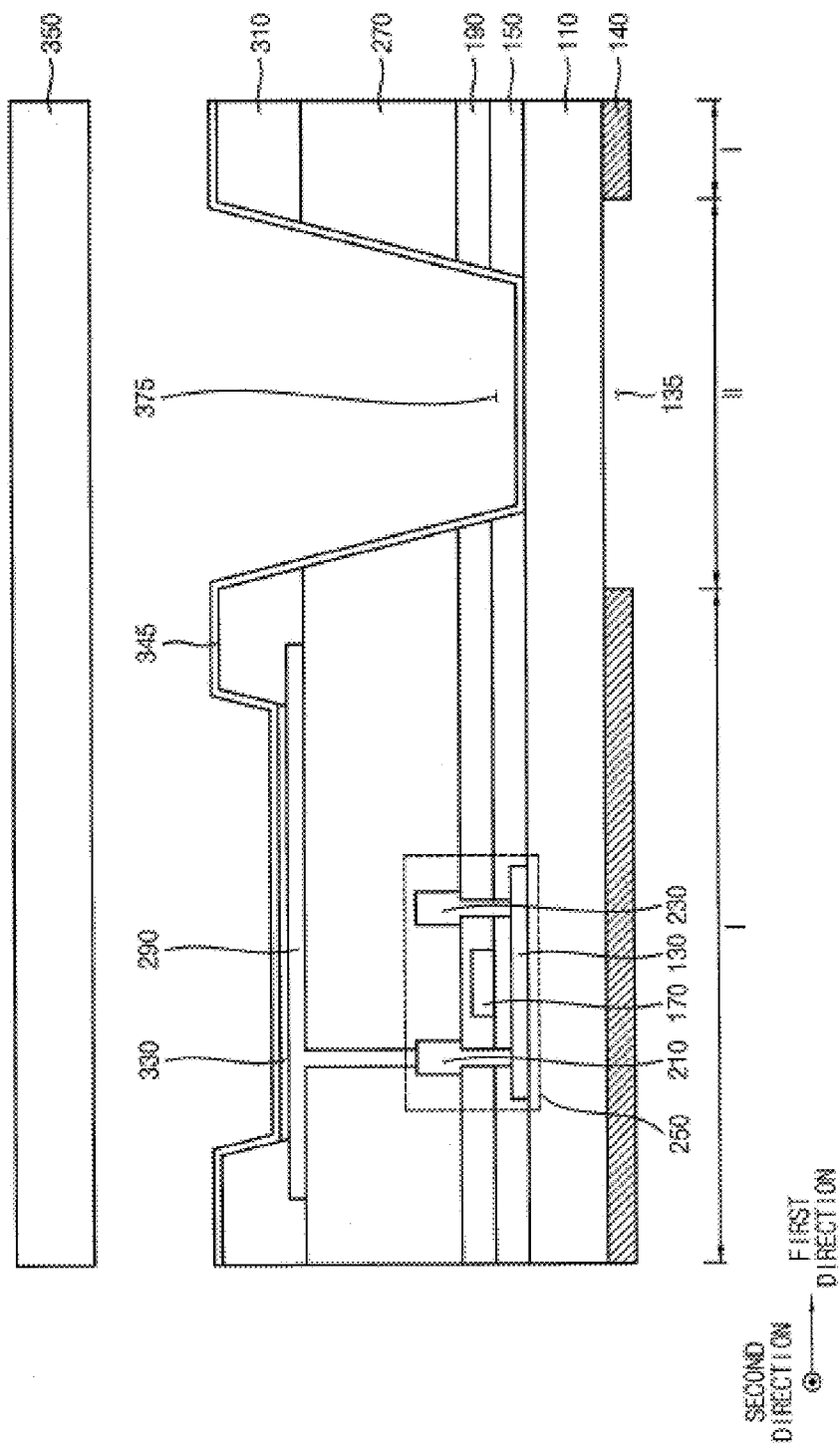
FIG. 7 is a cross sectional view illustrating a display panel in accordance with one or more exemplary embodiments.

FIG. 7 is a cross sectional view illustrating a display panel in accordance with one or more exemplary embodiments. A display panel illustrated in FIG. 7 may have a configuration substantially the same as or similar to that of a display panel described with reference to FIG. 6 except a shape of a second electrode. In FIG. 7, detailed descriptions for elements that are substantially the same as or similar to the elements described with reference to FIG. 6 will be omitted.

Referring to FIG. 7, a display panel may include substrate 110, light blocking member 140, first insulation layer 150, second insulation layer 190, third insulation layer 270, a light emitting structure, fourth insulation layer 310, transparent window 375, encapsulation substrate 350, etc. The light emitting structure may include semiconductor element 250, first electrode 290, light emitting layer 330, and second electrode 345. Semiconductor element 250 may include active layer 130, gate electrode 170, source electrode 210, and drain electrode 230. Light blocking member 140 may include opening 135.

As described above, the display panel may include a pixel region I and a transparent region II. Semiconductor element 250, first electrode 290, light emitting layer 330, second electrode 345, and light blocking member 140 may be located in pixel region I. In addition, transparent window 375 may be located in transparent region II. For example, a display image may be displayed in pixel regions I. An image of an object that is located to the rear of the display panel may be transmitted in transparent regions II. The display panel having the transparent regions II may serve as a transparent display device.

Second electrode 345 may be disposed on fourth insulation layer 310, light emitting layer 330, and a portion of substrate 110. Second electrode 345 may cover fourth insulation layer 310 and light emitting layer 330 in pixel region I, and may extend from pixel region I into transparent region II. That is, second electrode 345 may be entirely disposed across pixel region I and transparent region II. In addition, second electrode 345 may be shared by the first through third pixels (refer to FIG. 1). Second electrode 345 may be a relatively thin thickness. For example, a thickness of second electrode 345 may be determined such that a light transmissivity of second electrode 345 may be over about 50%. Second electrode 345 may include metal, alloy, metal nitride, conductive metal oxide, a transparent conductive material, etc. For example, second electrode 345 may include Al, aluminum alloy, AlNx, Ag, silver alloy, W, WNx, Cu, copper alloy, Ni, Cr, CrNx, Mo, molybdenum alloy, Ti, TiNx, Pt, Ta, TaNx, Nd, Sc, SRO, ZnOx, ITO, SnOx, InOx, GaOx, IZO, etc. Compared to a display panel of FIG. 6, as the display panel includes second electrode 345 located in transparent window 375, an IR drop capable of being generated in the display panel may decrease. In addition, as second electrode 345 having a relatively thin thickness is located in the transparent region II, transmissivity of the display panel may not be significantly reduced. Further, as the display panel includes light blocking member 140 having opening 135 that is the same as a size of the transparent region II and may have an opening 135 corresponding to the maximum size of opening 375 in a first direction, transmissivity of the display device may relatively increase. In addition, definition of an image of an object that is located in the rear of the display panel may increase.

Figure 8:
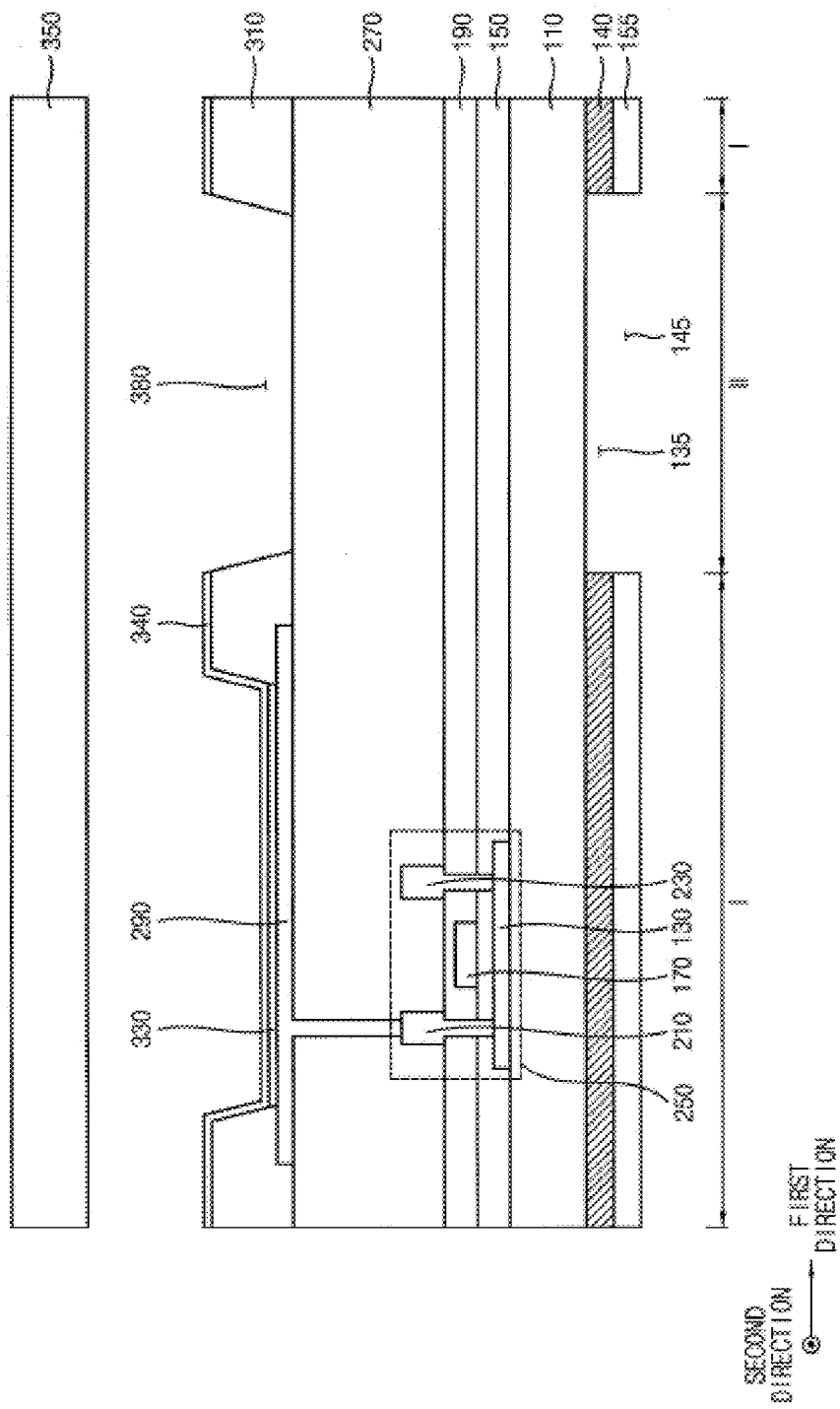
FIG. 8 is a cross sectional view illustrating a display panel in accordance with one or more exemplary embodiments.

FIG. 8 is a cross sectional view illustrating a display panel in accordance with one or more exemplary embodiments. A display panel illustrated in FIG. 8 may have a configuration substantially the same as or similar to that of a display panel described with reference to FIG. 6 except a shape of an insulation layer and a protection layer. In FIG. 8, detailed descriptions for elements that are substantially the same as or similar to the elements described with reference to FIG. 6 will be omitted.

Referring to FIG. 8, a display panel may include substrate 110, light blocking member 140, protection layer 155, first insulation layer 150, second insulation layer 190, third insulation layer 270, a light emitting structure, fourth insulation layer 310, transparent window 380, encapsulation substrate 350, etc. The light emitting structure may include semiconductor element 250, first electrode 290, light emitting layer 330, and second electrode 340. Semiconductor element 250 may include active layer 130, gate electrode 170, source electrode 210, and drain electrode 230. Light blocking member 140 may include opening 135. In addition, protection layer 155 may include opening 145.

As described above, the display panel may include pixel region I and transparent region II. Semiconductor element 250, first electrode 290, light emitting layer 330, second electrode 340, light blocking member 140, and protection layer 155 may be located in pixel region I. In addition, transparent window 380 may be located in transparent region II. For example, a display image may be displayed in pixel regions I. An image of an object that is located to the rear of the display panel may be transmitted in transparent regions II. As the display panel has transparent regions II, the display device may serve as a transparent display device.

Protection layer 155 may be disposed on a lower surface of light blocking member 140. Protection layer 155 may cover light blocking member 140, and may extend along a first direction from pixel region I into transparent region II or may end at the edge of transparent region II. Protection layer 155 may include opening 145 corresponding to transparent region II. A size of opening 145 of protection layer 155 may be substantially the same as that of opening 135 of light blocking member 140. That is, opening 145 of the protection layer 155 may overlap opening 135 of light blocking member 140. Protection layer 155 may protect the lower surface of light blocking member 140 from external impact. Protection layer 155 may include materials having a low reflectivity and a high transmissivity. In exemplary embodiments, protection layer 155 may include polyethylene terephthalate (PET). Alternately, protection layer 155 may be entirely disposed across pixel region I and transparent region II, without having an opening, such as opening 145.

First insulation layer 150 may be disposed on active layer 130. First insulation layer 150 may cover active layer 130, and may extend into transparent region II. That is, first insulation layer 150 may be entirely disposed across pixel region I and transparent region II. Second insulation layer 190 may be disposed on gate electrode 170. Second insulation layer 190 may cover gate electrode 170, and may extend into transparent region II. That is, second insulation layer 190 may be entirely disposed across pixel region I and transparent region II.

Third insulation layer 270 may be disposed on source electrode 210 and drain electrode 230. Third insulation layer 270 may cover source electrode 210 and drain electrode 230 in pixel region I, and may extend into transparent region II. That is, third insulation layer 270 may be entirely disposed across pixel region I and transparent region II. Each of first insulation layer 150, second insulation layer 190, and third insulation layer 270 may include transparent inorganic materials or transparent organic materials. For example, the inorganic materials may include silicon oxide, silicon nitride, silicon oxynitride, aluminum oxide (AlOx), aluminum nitride (AlNx), titanium oxide (TiOx), zinc oxide (ZnOx), etc. The organic materials may include acrylate monomer, phenylacetylene, diamine, dianhydride, siloxane, silane, parylene, polyethylene (PE), polypropylene (PP), polyethylene terephthalate (PET), fluororesin, polysiloxane, etc. When first insulation layer 150, second insulation layer 190, and third insulation layer 270 include substantially the same materials and substrate 110, encapsulation substrate 350, first insulation layer 150, second insulation layer 190, and third insulation layer 270 have substantially the same refractive index, light incident into transparent region II may not be refracted in each of contact interfaces of substrate 110, encapsulation substrate 350, first insulation layer 150, second insulation layer 190, and third insulation layer 270. Accordingly, transmissivity of the display panel may be increased, and definition may be improved.

Figure 9:
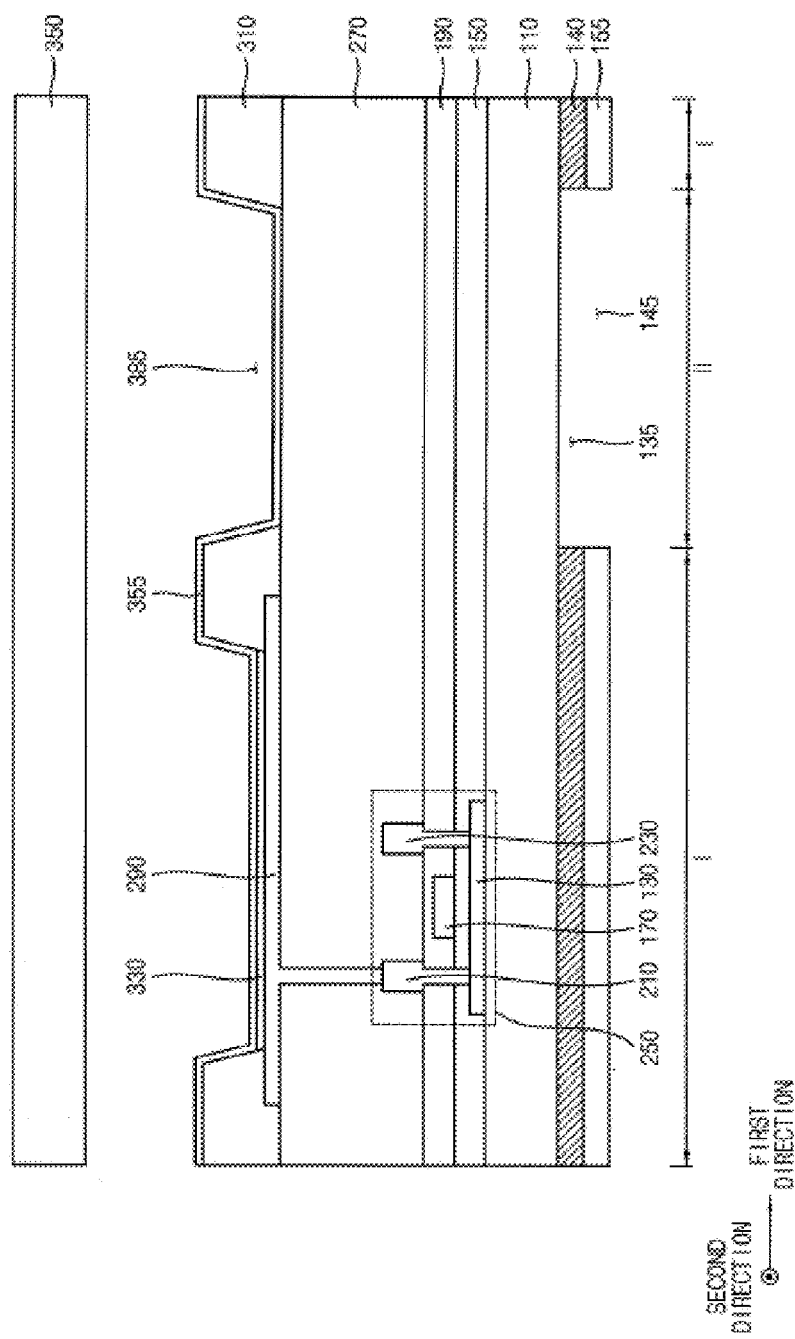
FIG. 9 is a cross sectional view illustrating a display panel in accordance with one or more exemplary embodiments.

FIG. 9 is a cross sectional view illustrating a display panel in accordance with one or more exemplary embodiments. A display panel illustrated in FIG. 9 may have a configuration substantially the same as or similar to that of a display panel described with reference to FIG. 8 except for a shape of a second electrode. In FIG. 9, detailed descriptions for elements that are substantially the same as or similar to the elements described with reference to FIG. 8 will be omitted.

Referring to FIG. 9, a display panel may include substrate 110, light blocking member 140, protection layer 155, first insulation layer 150, second insulation layer 190, third insulation layer 270, a light emitting structure, fourth insulation layer 310, transparent window 385, encapsulation substrate 350, etc. Here, the light emitting structure may include semiconductor element 250, first electrode 290, light emitting layer 330, and second electrode 355. Semiconductor element 250 may include active layer 130, gate electrode 170, source electrode 210, and drain electrode 230. Light blocking member 140 may include opening 135. In addition, protection layer 155 may include opening 145.

As described above, the display panel may include pixel region I and transparent region II. Semiconductor element 250, first electrode 290, light emitting layer 330, second electrode 355, light blocking member 140, and protection layer 155 may be located in pixel region I. In addition, transparent window 385 may be located in transparent region II. For example, a display image may be displayed in pixel regions I. An image of an object that is located to the rear of the display panel may be transmitted in transparent regions II. As the display panel has transparent regions II, the display device may serve as a transparent display device.

Second electrode 355 may be disposed on fourth insulation layer 310, light emitting layer 330, and a portion of third insulation layer 270. Second electrode 355 may cover fourth insulation layer 310 and light emitting layer 330 in pixel region I, and may extend from pixel region I into transparent region II. That is, second electrode 355 may be entirely disposed in pixel region I and transparent region II. In addition, second electrode 355 may be shared by first through third pixels (refer to FIG. 1). Second electrode 355 may be a relatively thin thickness. For example, a thickness of second electrode 355 may be determined such that light transmissivity of second electrode 355 may be over about 50%. Second electrode 355 may include metal, alloy, metal nitride, conductive metal oxide, a transparent conductive material, etc. Compared to a display panel of FIG. 8, as the display panel includes second electrode 355 located in transparent window 385, an IR drop capable of being generated in the display panel may be decreased. In addition, as second electrode 355 has a relatively thin thickness, a transmissivity of the display panel may not be significantly reduced. Further, when first insulation layer 150, second insulation layer 190, and third insulation layer 270 include substantially the same materials and substrate 110, encapsulation substrate 350, first insulation layer 150, second insulation layer 190, and third insulation layer 270 have substantially the same refractive index, light incident into transparent region II may not be refracted in each of contact interfaces of substrate 110, encapsulation substrate 350, first insulation layer 150, second insulation layer 190, and third insulation layer 270. Accordingly, transmissivity of the display panel may increase, and definition may be improved.

Figure 10:
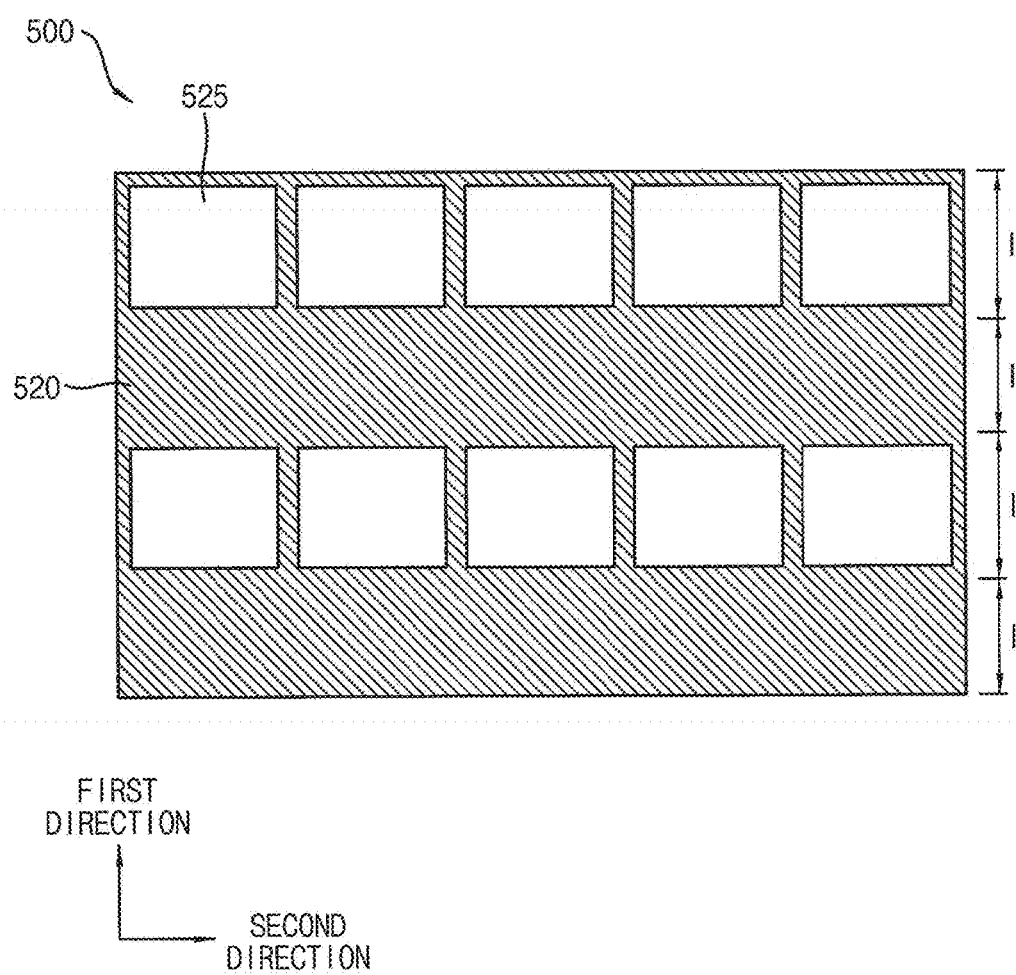
FIG. 10 is a plan view illustrating a display panel in accordance with one or more exemplary embodiments.

FIG. 10 is a plan view illustrating a display panel in accordance with one or more exemplary embodiments. Display panel 500 illustrated in FIG. 10 may have a configuration substantially the same as or similar to that of display panel 100 described with reference to FIGS. 1 and 2. In FIG. 10, detailed descriptions for elements that are substantially the same as or similar to the elements described with reference to FIGS. 1 and 2 will be omitted.

Referring to FIG. 10, display panel 500 may include a plurality of pixel regions I and a plurality of transparent regions II.

In an upper surface of a substrate, first through third pixels may be located in each of pixel regions I. Transparent windows may be located in each of transparent regions II. In pixel region I, the first pixel may be a pixel emitting a red color. The second pixel may be a pixel emitting a green color. The third pixel may be a pixel emitting a blue color. The first through third pixels may be disposed at the same layer. In transparent regions II, transparent windows may transmit external light.

On a lower surface of the substrate, a light blocking member 520 may be disposed in pixel regions I. Openings 525 may be located in transparent regions II. Light blocking member 520 may substantially surround openings 525. Light blocking member 520 may prevent external light from being reflected by the substrate and the light emitting structures, except for a portion of transparent regions II in which openings 525 are located. To prevent reflection of the external light, light blocking member 520 may include light blocking materials. For example, the light blocking materials may include carbon black, titanium nitride oxide, titanium black, phenylene black, aniline black, cyanine black, nigrosine acid black, etc. Light blocking member 520 may include a resin having the light blocking materials. The resin capable of being used as light blocking member 520 may include epoxy resin, acryl resin, siloxane resin, polymer resin, polyimide resin, etc. In exemplary embodiments, light blocking member 520 may include the siloxane resin having a high heat resistance. A size of opening 525 may be the same as that of transparent region II (e.g., transparent window). In some exemplary embodiments, a size of opening 525 of light blocking member 520 may be less than that of the transparent window. In exemplary embodiments, pixel region I and transparent region II may be alternately arranged in a first direction and a second direction. Here, the first direction is a direction from pixel region I into transparent region II, and the second direction is substantially perpendicular to the first direction.

Figure 11:
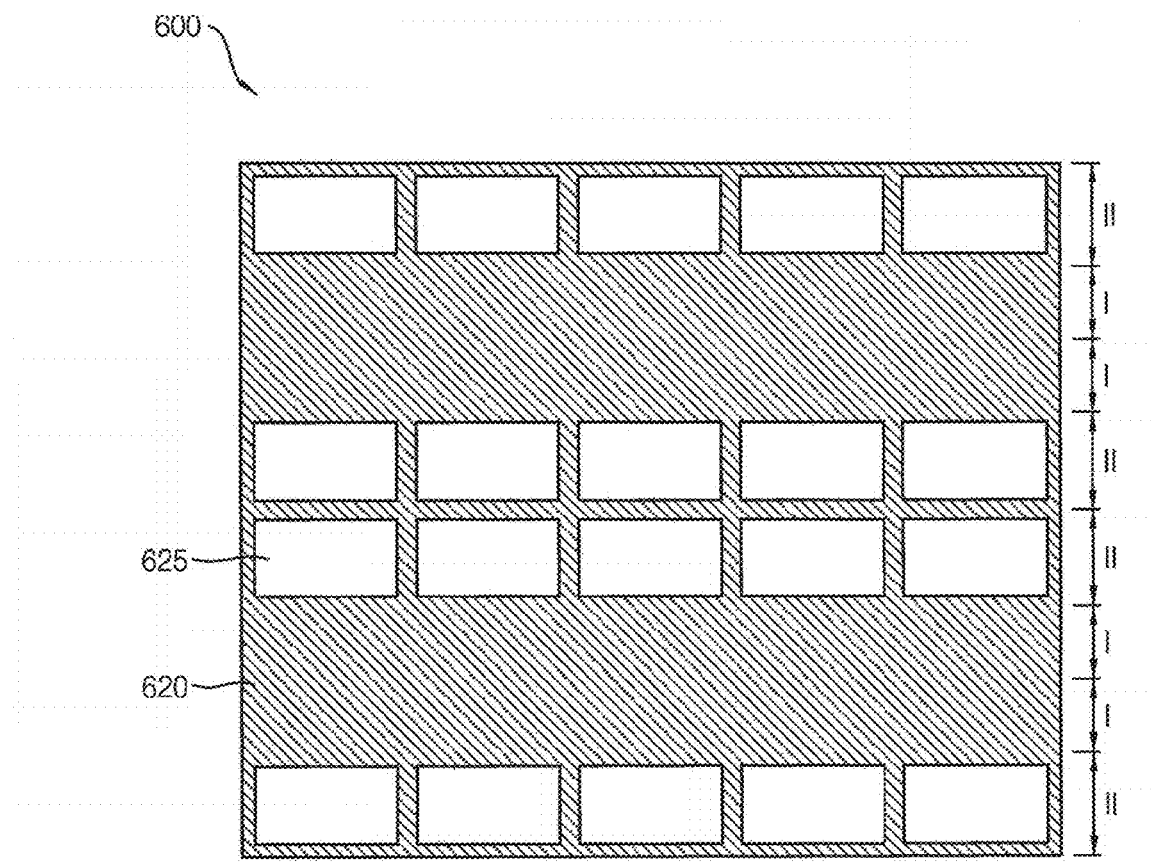
FIG. 11 is a plan view illustrating a display panel in accordance with exemplary embodiments.

FIG. 11 is a plan view illustrating a display panel in accordance with exemplary embodiments. Display panel 600 illustrated in FIG. 11 may have a configuration substantially the same as or similar to that of display panel 100 described with reference to FIGS. 1 and 2. In FIG. 11, detailed descriptions for elements that are substantially the same as or similar to the elements described with reference to FIGS. 1 and 2 will be omitted.

Referring to FIG. 11, display panel 600 may include a plurality of pixel regions I and a plurality of transparent regions II.

On an upper surface of a substrate, first through third pixels may be located in each of pixel regions I. Transparent windows may be located in each of the transparent regions II. In pixel region I, the first pixel may be a pixel emitting a red color. The second pixel may be a pixel emitting a green color. The third pixel may be a pixel emitting a blue color. The first through third pixels may be disposed at the same layer. In the transparent region II, the transparent windows may transmit external light.

On a lower surface of the substrate, light blocking member 620 may be disposed in pixel regions I. Openings 625 may be located in transparent regions II. Light blocking member 620 may substantially surround openings 625. Light blocking member 620 may prevent external light from being reflected from the substrate and the light emitting structure, except for a portion of transparent regions II in which opening 625 are located. To prevent reflection of external light, light blocking member 620 may include light blocking materials and a resin having the light blocking materials. In exemplary embodiments, light blocking member 620 may include siloxane resin having a high heat resistance. A size of opening 625 may be the same as that of transparent region II (e.g., transparent window). In some exemplary embodiments, a size of opening 625 of light blocking member 620 may be less than that of the transparent window. In exemplary embodiments, at least two of the pixel regions I are adjacent and at least two of the transparent regions II may be alternately arranged to each side of the adjacent in a first direction and a second direction. Here, the first direction is a direction from the pixel region I into the transparent region II, and the second direction is substantially perpendicular to the first direction.

Figure 12:
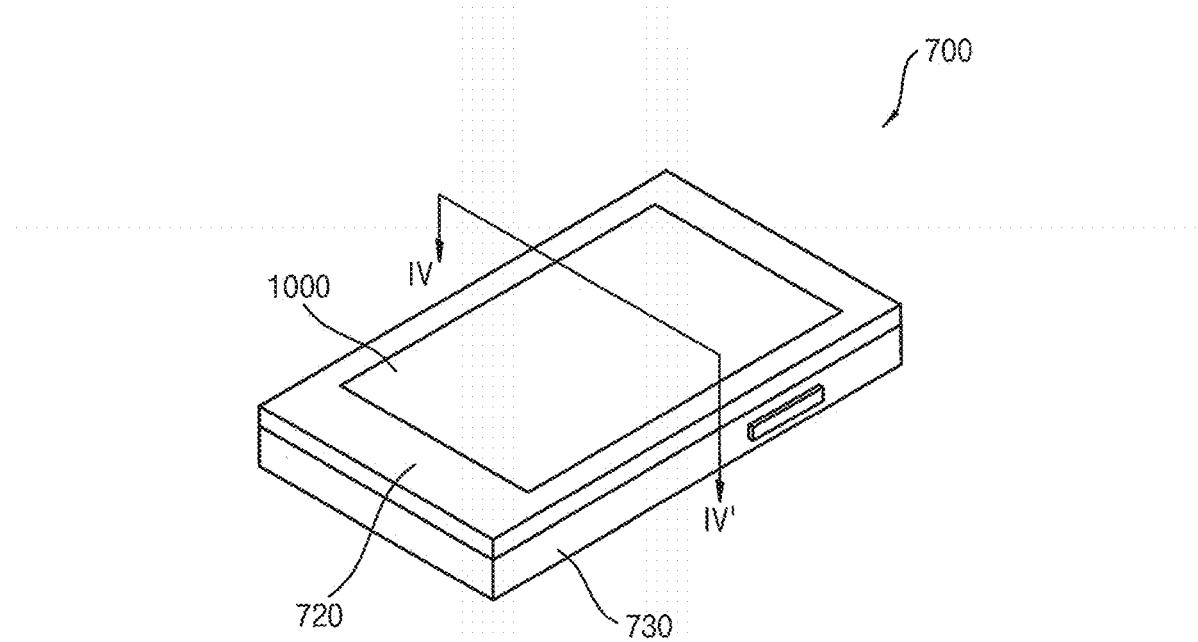
FIG. 12 is a perspective view illustrating an organic light emitting display device in accordance with exemplary embodiments.
Figure 13:
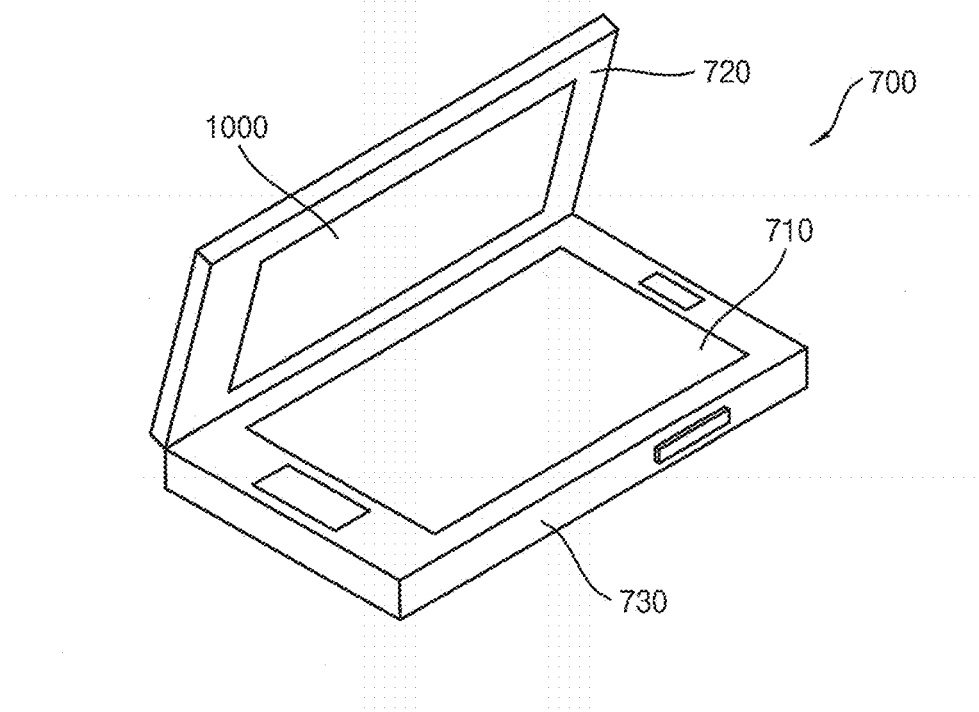
FIG. 13 is a perspective view for describing an organic light emitting display device of FIG. 12.
Figure 14:
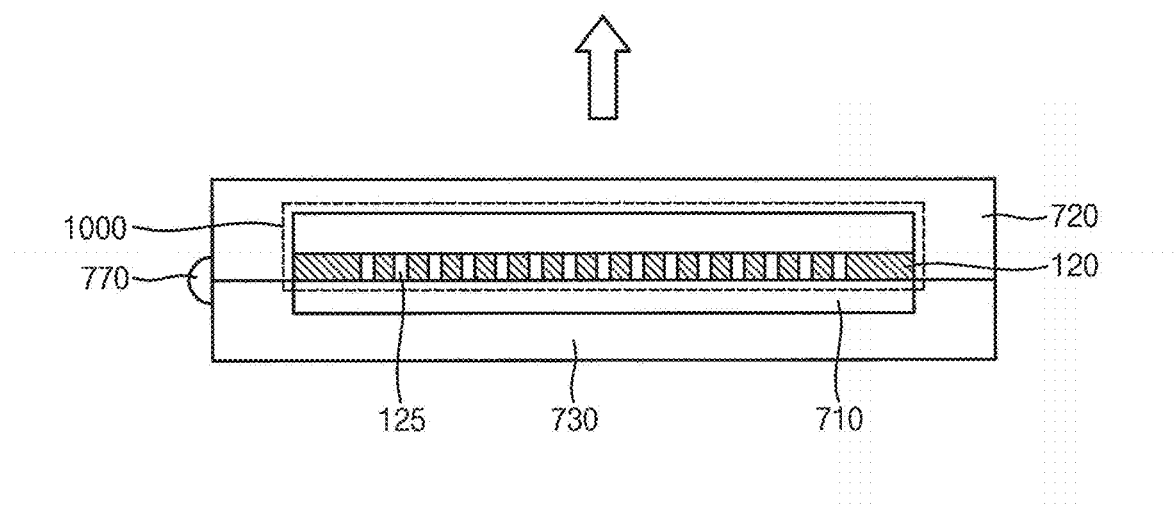
FIG. 14 is a cross sectional view illustrating an organic light emitting display device taken along a line IV-IV' of FIG. 12.
Figure 15:
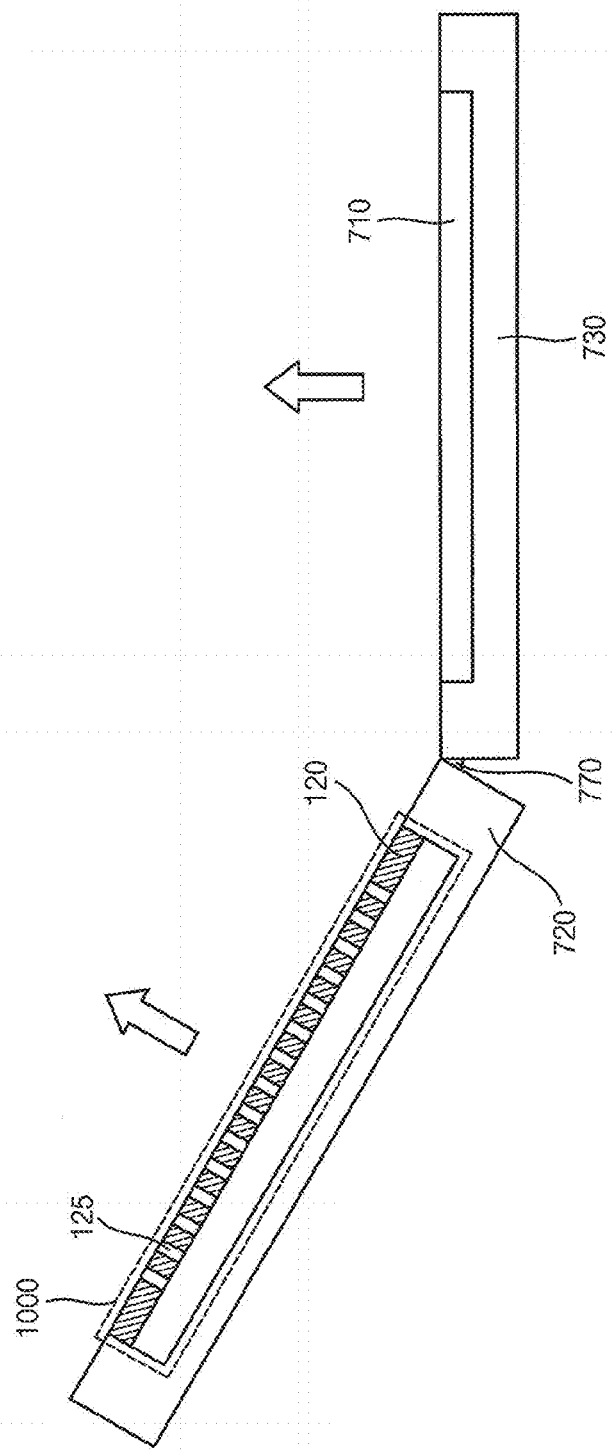
FIG. 15 is a cross sectional view for describing an organic light emitting display device of FIG. 12.

FIG. 12 is a perspective view illustrating an organic light emitting display device in accordance with one or more exemplary embodiments, and FIG. 13 is a perspective view for describing an organic light emitting display device of FIG. 12. FIG. 14 is a cross sectional view illustrating an organic light emitting display device taken along a line IV-IV' of FIG. 12, and FIG. 15 is a cross sectional view for describing an organic light emitting display device of FIG. 12. First display panel 1000 included in organic light emitting display device 700 illustrated in FIGS. 12 through 14 may have a configuration substantially the same as or similar to that of display panel 100 described with reference to FIGS. 1 through 3. In FIGS. 12 through 14, detailed descriptions for elements that are substantially the same as or similar to the elements described with reference to FIGS. 1 through 3 will be omitted.

Referring to FIGS. 12 through 14, organic light emitting display device 700 may include first display panel 1000, first body 720, second display panel 710, second body 730, and connection member 770. Here, first display panel 1000 may include light blocking member 120, a substrate having a plurality of pixel regions, a plurality of transparent regions, a plurality of light emitting structures located in the pixel regions, an encapsulation substrate, etc. Here, a transparent window may be located in one transparent region.

First body 720 may substantially surround first display panel 1000. First body 720 may protect first display panel 1000 from external impact. For example, first body 720 may include synthetic resin or metal (e.g., stainless steel, titanium (Ti), etc). First display panel 1000 may display a display image by a light emitting layer included in each of the light emitting structures. In addition, first display panel 1000 may transmit an image of an object that is located to the rear of first display panel 1000 by transparent windows located in each of the transparent regions.

Light blocking member 120 may be disposed on a lower portion (e.g., surface) of first display panel 1000. Light blocking member 120 may include a plurality of openings 125. A size of opening 125 may be the same as that of the transparent window. Alternately, a size of opening 125 may be less than that of the transparent window.

In exemplary embodiments, to combine the substrate with the encapsulation substrate, first display panel 1000 may further include a sealant. The sealant may be disposed in both side portions (or opposite side portions) between the substrate and the encapsulation substrate. The sealant may include a frit. The substrate and the encapsulation substrate may be combined to each other through a laser irradiation. Here, the laser may be irradiated into the sealant. In the laser irradiation process, a phase of the sealant may be changed from a solid phase to a liquid phase. Then, the sealant having the liquid phase may be cured so that the sealant may have the solid phase again after a predetermined time. In accordance with the phase change of the sealant, the substrate may be combined with the encapsulation substrate. The seal combination of the substrate and the encapsulation substrate may protect first display panel 1000 from permeation of water and moisture. First display panel 1000 may not be deteriorated by the water and the moisture.

Second display panel 710 may be opposite to first display panel 1000. Second body 730 may substantially surround second display panel 710. That is, first body 720 may be opposite to second body 730. Second body 730 may protect second display panel 710, capable of displaying a display image, from external impact. For example, second body 730 and first body 720 may include the same materials. Alternately, second body 730 and first body 720 may include different materials.

Each of first body 720 and second body 730 may include a first side and a second side that is opposite to the first side. Connection member 770 may be disposed in the first side of first body 720 and second body 730. Connection member 770 may connect first body 720 and second body 730. First body 720 or second body 730 may rotate on connection member 770 as an axis. Thus, the second side of first body 720 and second body 730 may be open or closed.

In exemplary embodiments, as illustrated in FIG. 14, organic light emitting display device 700 may perform a first mode. When first body 720 contacts second body 730, the first mode may be performed. In case of the first mode, light blocking member 120 may be substantially located between first display panel 1000 and second display panel 710. Here, a display image of second display panel 710 may be seen through first display panel 1000. For example, the light emitting structures included in first display panel 1000 may be a turned-off state by a controller. In this case, a display image of second display panel 710 may be transmitted through the transparent window and openings 125 of light blocking member 120 of first display panel 1000. The controller of the organic light emitting display device 700 may permit a user to watch the display image of second display panel 710 in the first mode. When an organic light emitting display device does not include a light blocking member, visibility of the display image of a second display panel may decrease because a portion of a light emitted in the second display panel is reflected from a plurality of electrodes, contact interfaces of insulation layers, and surfaces of the substrate of the first display panel. Accordingly, as organic light emitting display device 700 has light blocking member 120, reflection of external light may decrease. In addition, visibility of the display image of the second display panel 710 may be improved.

As illustrated in FIG. 15, organic light emitting display device 700 may perform a second mode. When first body 720 is spaced apart from second body 730, the second mode may be performed. In case of the second mode, the controller may cause a display image to be displayed in first display panel 1000, and an image of an object that is located in the rear of first display panel 1000 through the transparent window may be transmitted. For example, the light emitting structures included in first display panel 1000 may be a turned-on state. In this case, the image of the object that is located in the rear of first display panel 1000 may be transmitted through the transparent window and openings 125 of light blocking member 120 of first display panel 1000. That is, the display image and the transmitted image may be simultaneously displayed in first display panel 1000. In addition, second display panel 710 may display another display image. The user of organic light emitting display device 700 may simultaneously watch the display image and the transmitted image of first display panel 1000 and the display image of second display panel 710 in the second mode. Here, when an organic light emitting display device does not include a light blocking member, visibility of the display image of the second display panel may decrease because a portion of light emitted in second display panel is reflected from a plurality of electrodes, contact interfaces of insulation layers, and surfaces of the substrate of the first display panel. Accordingly, as organic light emitting display device 700 has light blocking member 120, reflection of external light may decrease. In addition, the visibility of the display image of second display panel 710 may be improved.

The present invention may be applied to various display devices including a display panel and an organic light emitting display device having the display panel. For example, the present invention may be applied to vehicle-display device, a ship-display device, an aircraft-display device, portable communication devices, display devices for display or for information transfer, a medical-display device, etc.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display panel, comprising:
    a substrate;
    light emitting structures disposed on an upper surface of the substrate in pixel regions;
    an encapsulation substrate disposed over the light emitting structures;
    a light blocking member disposed on a lower surface of the substrate, the light blocking member having blocking portions corresponding to the pixel regions and openings corresponding to transparent regions; and
    a protection layer disposed on the lower surface of the substrate, covering the light blocking member, and including openings that overlap the openings of the light blocking member,
    wherein a size of openings of the protection layer is the same as a size of openings of the light blocking member.

2. The display panel of claim 1, wherein a size of openings of the light blocking member is the same as a size of the transparent regions, respectively.

3. The display panel of claim 1, wherein the blocking portions of the light blocking member extend along a first direction from a pixel region into a transparent region on the lower surface of the substrate, and a size of openings of the light blocking member is less than a size of the transparent regions, respectively.

4. The display panel of claim 1, wherein light emitting structures respectively include:
    at least one semiconductor element disposed on the substrate in a pixel region, the semiconductor element including an active layer, a gate electrode, a source electrode, and a drain electrode;
    a first electrode disposed on the semiconductor element;
    a light emitting layer disposed on the first electrode; and
    a second electrode disposed on the light emitting layer.

5. The display panel of claim 4, further comprising:
    a first insulation layer disposed on the substrate, covering the active layer, and extending along a first direction from a pixel region into a transparent region;
    a second insulation layer disposed on the first insulation layer, covering the gate electrode, and extending along the first direction;
    a third insulation layer disposed on the second insulation layer, covering the source and drain electrodes, and extending along the first direction; and
    a fourth insulation layer disposed on the third insulation layer and exposing a portion of the first electrode.

6. The display panel of claim 5, wherein at least one of a portion of the first through fourth insulation layers is located in the transparent region.

7. The display panel of claim 5, wherein the first through fourth insulation layers are not located in the transparent region.

8. The display panel of claim 5, wherein the second electrode is not located in the transparent region.

9. The display panel of claim 5, wherein the second electrode is located in the transparent region.

10. The display panel of claim 1, wherein pixel regions and transparent regions are alternately arranged in a first direction, and a row of pixel regions and a row of transparent regions are disposed in a second direction perpendicular to the first direction.

11. An organic light emitting display device, comprising:
    a first display panel;
    a first body surrounding the first display panel;
    a second display panel opposite to the first display panel;
    a second body surrounding the second display panel; and
    a connection member connecting the first body and the second body,
    wherein the first display panel comprises:
        a substrate;
        light emitting structures disposed on an upper surface of the substrate in pixel regions;
        an encapsulation substrate disposed over the light emitting structures; and
        a light blocking member disposed on a lower surface of the substrate, the light blocking member having blocking portions corresponding to the pixel regions and openings corresponding to transparent regions, and
    wherein the first body and the second body are rotatable on the connection member.

12. The organic light emitting display device of claim 11, further comprising a controller to operate in:
    a first mode in which the first display panel contacts the second display panel; and
    a second mode in which the first display panel is spaced apart from the second display panel.

13. The organic light emitting display device of claim 12, wherein when the first mode is performed, a display image is not displayed in the first display panel, and
    a display image of the second display panel is transmitted through the openings of the light blocking member of the first display panel and the transparent regions.

14. The organic light emitting display device of claim 12, wherein, when the second mode is performed, a display image is displayed in the pixel regions of the first display panel.

15. The organic light emitting display device of claim 12, wherein when the second mode is performed, an image of an object that is located in the rear of the organic light emitting display device is transmitted through the transparent regions.

16. An organic light emitting display device, comprising:
    a first display panel;
    a first body surrounding the first display panel;
    a second display panel opposite to the first display panel;
    a second body surrounding the second display panel; and
    a connection member connecting the first body and the second body,
    wherein the first display panel comprises:
        a substrate;
        light emitting structures disposed on an upper surface of the substrate in pixel regions;

an encapsulation substrate disposed over the light emitting structures;

a light blocking member disposed on a lower surface of the substrate, the light blocking member having blocking portions corresponding to the pixel regions and openings corresponding to transparent regions; and a protection layer disposed on the lower surface of the substrate, covering the light blocking member, and including openings that overlap the openings of the light blocking member, wherein a size of openings of the protection layer is the same as a size of openings of the light blocking member.

* * * * *